US009714165B1

(12) United States Patent
Hrudey

(10) Patent No.: US 9,714,165 B1
(45) Date of Patent: Jul. 25, 2017

(54) MEMS SENSOR

(71) Applicant: PANASONIC CORPORATION, Osaka (JP)

(72) Inventor: Peter Charles Philip Hrudey, Watertown, MA (US)

(73) Assignee: PANASONIC CORPORATION, Osaka (JP)

(*) Notice: Subject to any disclaimer, the term of this patent is extended or adjusted under 35 U.S.C. 154(b) by 0 days.

(21) Appl. No.: 14/797,958

(22) Filed: Jul. 13, 2015

Related U.S. Application Data

(60) Provisional application No. 62/024,221, filed on Jul. 14, 2014, provisional application No. 62/024,721, filed on Jul. 15, 2014.

(51) Int. Cl.
H01L 23/00 (2006.01)
B81B 3/00 (2006.01)
B81C 1/00 (2006.01)

(52) U.S. Cl.
CPC ........ *B81B 3/0021* (2013.01); *B81C 1/00523* (2013.01); *B81B 2201/0235* (2013.01); *B81B 2201/0242* (2013.01); *B81B 2203/04* (2013.01)

(58) Field of Classification Search
CPC ... H01L 29/84; H01L 29/86; H01L 2924/146; H01L 41/1134; H01L 41/1136; H01L 41/1138
USPC ................................. 257/415–419
See application file for complete search history.

(56) References Cited

U.S. PATENT DOCUMENTS

| 7,671,431 B1* | 3/2010 | Kubena | G01C 19/5719 257/417 |
| 9,130,531 B1* | 9/2015 | Cheng | H01L 27/092 |
| 2006/0255443 A1* | 11/2006 | Hwang | H01L 23/04 257/686 |

* cited by examiner

*Primary Examiner* — Cuong Q Nguyen
(74) *Attorney, Agent, or Firm* — McDermott Will & Emery LLP

(57) ABSTRACT

A semiconductor manufacturing process enables a complex multi-layer, silicon based MEMS devices, such as a gyroscope or accelerometer to be formed without using Silicon On Insulator (SOI) substrates and obviates the need to purchase and use SOI wafers as starting materials. The disclosed techniques further allows the etching of the sacrificial oxide to be "head started" prior to fusion bonding, thereby reducing the amount of release etching required at the end of the MEMS wafer processing.

18 Claims, 56 Drawing Sheets

XY-gyro

1. Start with double-side polished Si

2. Grow thermal oxide

3. LITHO 1 - CAVITY: Pattern and etch thick oxide and cavities

XY-gyro

5. Start with double-side polished Si

6. Grow thermal oxide

7. LITHO 2 - VERTICAL ELECTRODES: Pattern and etch trenches

XY-gyro

8. Grow SacOx then deposit poly

9. Remove backside poly and poly overburden

10. LITHO 3 - THK OX: Pattern and etch oxide

XY-gyro

11. LITHO 4 - THN OX: Pattern and partially etch oxide

12. LITHO 5 - BUMPS: Pattern and partially etch oxide

13. Deposit poly

XY-gyro

14. LITHO 6 - BOTTOM POLY: Pattern and etch poly

15. Wet etch oxide to open up bond surface and partially etch SacOx

16. BOND 1 - Fusion bond Device Wafer to Cavity Wafer

XY-gyro
17. Grind and polish excess Device Wafer to meet device layer thickness target
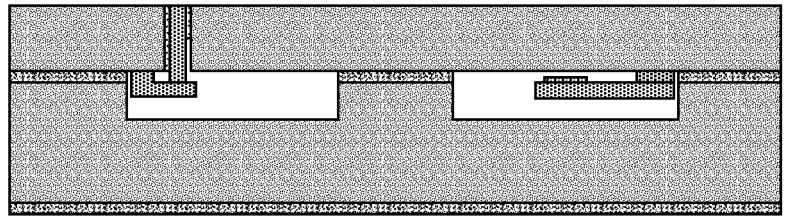
FIG. 2P
18. LITHO 7 - FLOW STOP: Pattern and partially etch device layer
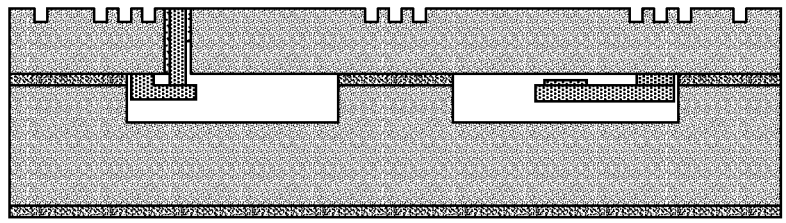
FIG. 2Q
18. LITHO 7 - FLOW STOP: Pattern and partially etch device layer
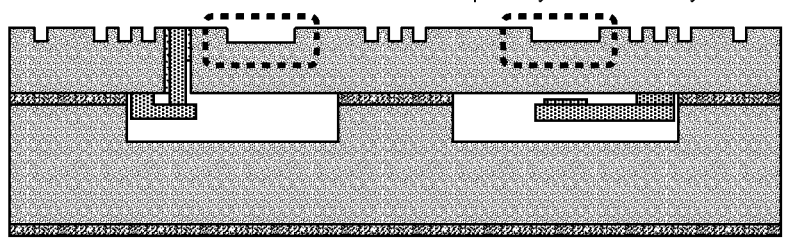
FIG. 2Q1

XY-gyro

18. LITHO 7 - FLOW STOP: Pattern and partially etch device layer

FIG. 2Q2

19. LITHO 8 - RELEASE HOLE: Pattern and etch device layer

20. Release in HF or vapor HF

XY-gyro

20. Release in HF or vapor HF

FIG. 2S1

21. Start with double-side polished Si

22. LITHO 9 - VIAS: Pattern and etch via trenches

XY-gyro

23. Grow liner oxide

24. Deposit poly

25. Remove backside poly and poly overburden

XY-gyro

26. Grow 1 um of insulator oxide

27. LITHO 10 - CONTACT CAVITY SIDE: Pattern and etch oxide to open contact to vias 28. Deposit bonding metal XY-gyro 29. LITHO 11 -BOND METAL: Pattern and etch bond metal film 30. BOND 2 - Eutectic Bond Cap wafer to MEMS wafer XY-gyro
31. Grind and polish excess Cap Wafer to meet device layer thickness target
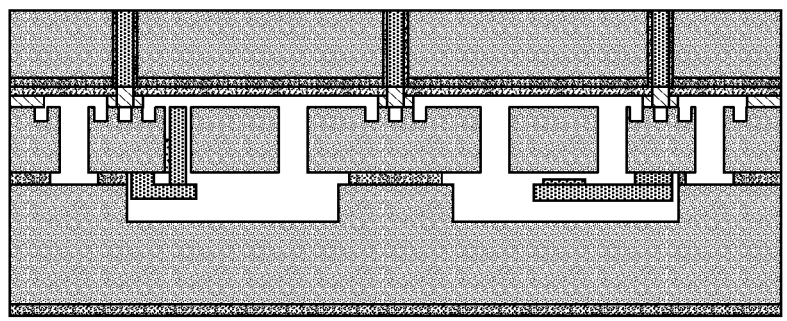
FIG. 2DD
31. Grind and polish excess Cap Wafer to meet device layer thickness target
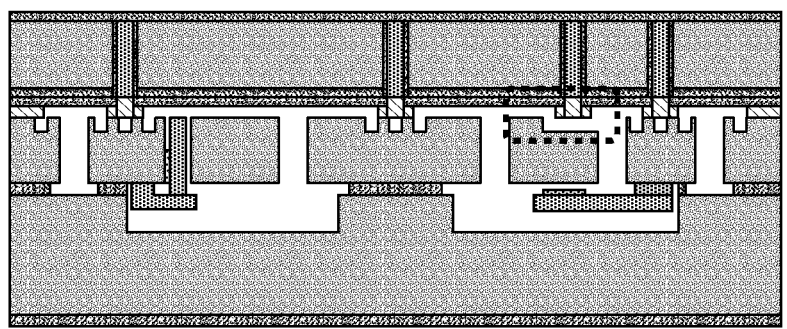
FIG. 2DD1

XY-gyro
32. Deposit 1 um oxide film

33. LITHO 12 - CONTACT EXTERIOR SIDE: Pattern and etch oxide to open contacts to vias XY-gyro
34. Deposit metal routing film 35. LITHO 13 - BOND PAD PLATING: Pattern to expose regions upon which to have bond pad metal plated XY-gyro 36. LITHO 14 - METAL ROUTING EXTERIOR SIDE: Pattern and etch metal routing layer 37. Deposit SiO2/SiN passivation films XY-gyro 38. LITHO 15 - PASSIVATION OPENING EXTERIOR SIDE: Pattern and etch openings in passivation films to access bond pads

SILICON  THICK OXIDE  POLYSILICON  METAL  SACRIFICAL OXIDE-1  PHOTORESIST

Z-gyro

1. Start with double-side polished Si

2. Grow thermal oxide

3. LITHO 1 - CAVITY: Pattern and etch thick oxide and cavities

Z-gyro

5. Start with double-side polished Si

6. Grow thermal oxide

7. LITHO 2 - VERTICAL ELECTRODES: Pattern and etch trenches

Z-gyro

11. LITHO 4 - THN OX: Pattern and partially etch oxide

12. LITHO 5 - BUMPS: Pattern and partially etch oxide

13. Deposit poly

Z-gyro

14. LITHO 6 - BOTTOM POLY: Pattern and etch poly

15. Wet etch oxide to open up bond surface and partially etch SacOx

16. BOND 1 - Fusion bond Device Wafer to Cavity Wafer

Z-gyro
17. Grind and polish excess Device Wafer to meet device layer thickness target.
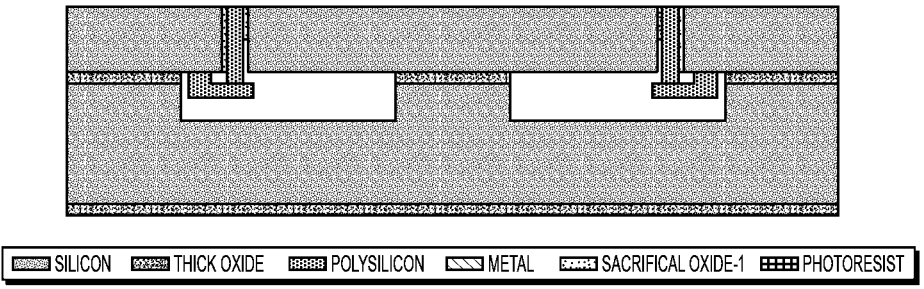
FIG. 3P
18. LITHO 7 - FLOW STOP: Pattern and partially etch device layer
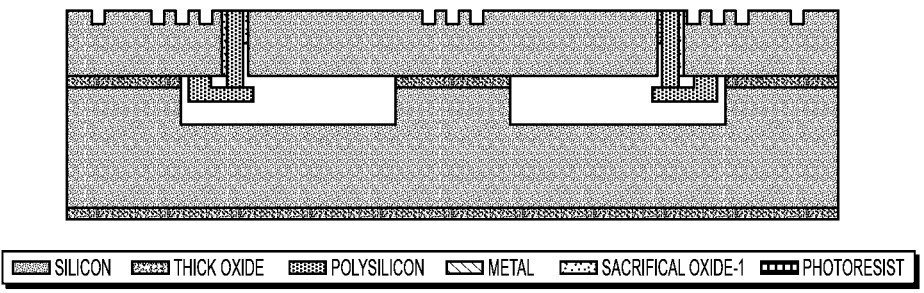
FIG. 3Q
18. LITHO 7 - FLOW STOP: Pattern and partially etch device layer
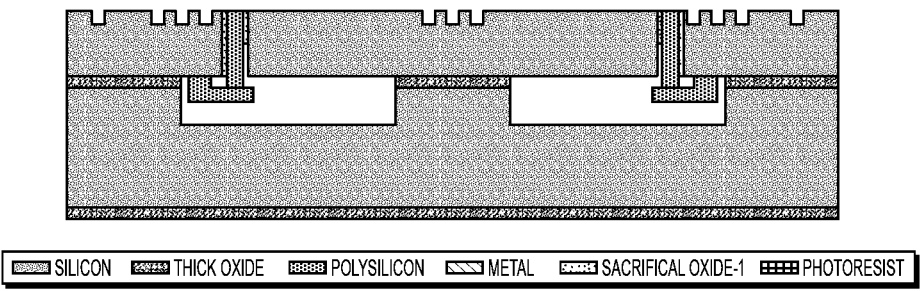
FIG. 3Q1

Z-gyro

18. LITHO 7 - FLOW STOP: Pattern and partially etch device layer

FIG. 3Q2

19. LITHO 8 - RELEASE HOLE: Pattern and etch device layer

20. Release in HF or vapor HF

Z-gyro

20. Release in HF or vapor HF

FIG. 3S1

21. Start with double-side polished Si

22. LITHO 9 - VIAS: Pattern and etch via trenches

Z-gyro

23. Grow liner oxide

24. Deposit poly

25. Remove backside poly and poly overburden

Z-gyro

26. Grow 1 um of insulator oxide

27. LITHO 10 - CONTACT CAVITY SIDE: Pattern and etch oxide to open contact to vias 28. Deposit bonding metal Z-gyro 29. LITHO 11 -BOND METAL: Pattern and etch bond metal film 30. BOND 2 - Eutectic Bond Cap wafer to MEMS wafer Z-gyro
31. Grind and polish excess Cap Wafer to meet device layer thickness target
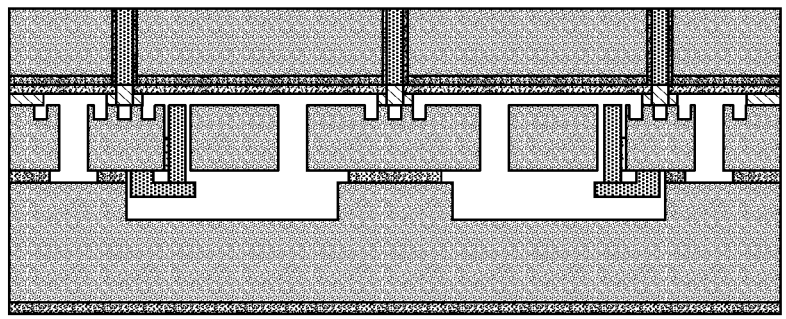
FIG. 3DD
31. Grind and polish excess Cap Wafer to meet device layer thickness target
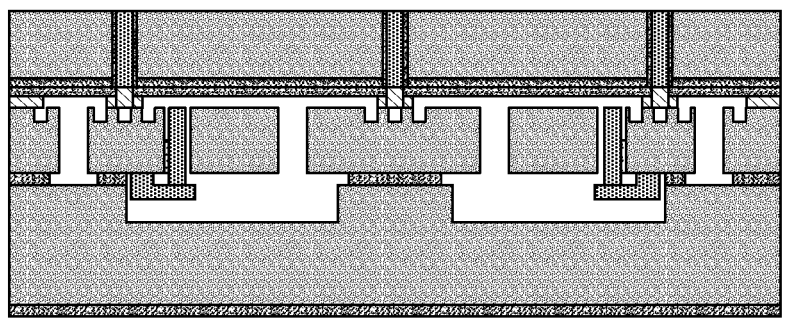
FIG. 3DD1

Z-gyro

32. Deposit 1 um oxide film

33. LITHO 12 - CONTACT EXTERIOR SIDE: Pattern and etch oxide to open contacts to vias Z-gyro 34. Deposit metal routing film 35. LITHO 13 - BOND PAD PLATING: Pattern to expose regions upon which to have bond pad metal plated Z-gyro 36. LITHO 14 - METAL ROUTING EXTERIOR SIDE: Pattern and etch metal routing layer 37. Deposit SiO2/SiN passivation films XYZ-axl 1. Start with double-side polished Si 2. Grow thermal oxide 3. LITHO 1 - CAVITY: Pattern and etch thick oxide and cavities XYZ-axl 5. Start with double-side polished Si 6. Grow thermal oxide 7. LITHO 2 - VERTICAL ELECTRODES: Pattern and etch trenches XYZ-axl
11. LITHO 4 - THN OX: Pattern and partially etch oxide 12. LITHO 5 - BUMPS: Pattern and partially etch oxide 13. Deposit poly XYZ-axl 14. LITHO 6 - BOTTOM POLY: Pattern and etch poly 15. Wet etch oxide to open up bond surface and partially etch SacOx 16. BOND 1 - Fusion bond Device Wafer to Cavity Wafer XYZ-axl
17. Grind and polish excess Device Wafer to meet device layer thickness target
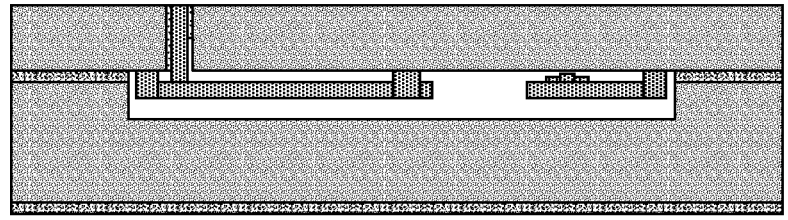
FIG. 4P
18. LITHO 7 - FLOW STOP: Pattern and partially etch device layer
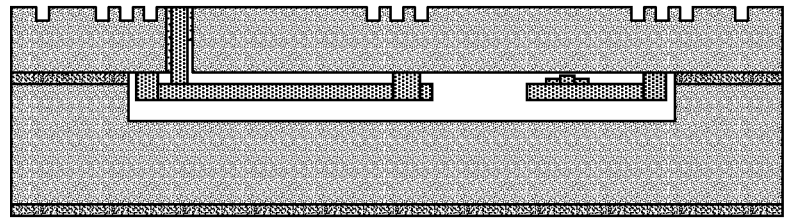
FIG. 4Q
18. LITHO 7 - FLOW STOP: Pattern and partially etch device layer
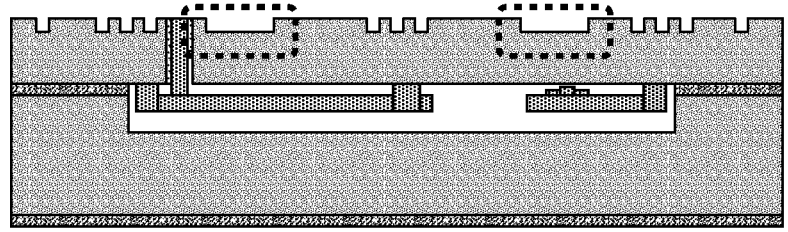
FIG. 4Q1

XYZ-axl

18. LITHO 7 - FLOW STOP: Pattern and partially etch device layer

FIG. 4Q2

19. LITHO 8 - RELEASE HOLE: Pattern and etch device layer

20. Release in HF or vapor HF

XYL-axl

20. Release in HF or vapor HF

FIG. 4S1

21. Start with double-side polished Si

22. LITHO 9 - VIAS: Pattern and etch via trenches

XYZ-axl
23. Grow liner oxide

24. Deposit poly

25. Remove backside poly and poly overburden

XYZ-axl
26. Grow 1 um of insulator oxide

27. LITHO 10 - CONTACT CAVITY SIDE: Pattern and etch oxide to open contact to vias 28. Deposit bonding metal XYZ-axl 29. LITHO 11 -BOND METAL: Pattern and etch bond metal film 30. BOND 2 - Eutectic Bond Cap wafer to MEMS wafer

Z-gyro
31. Grind and polish excess Cap Wafer to meet device layer thickness target
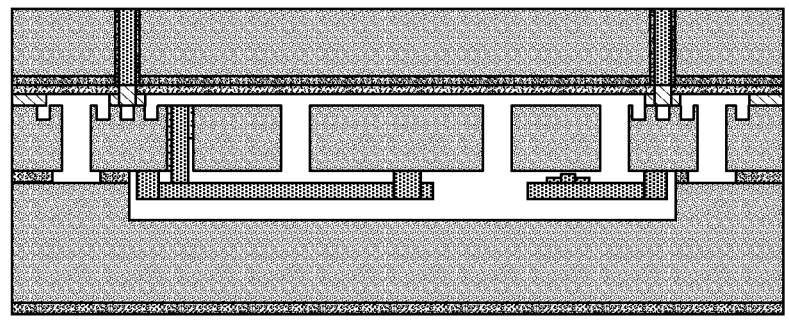
FIG. 4DD
31. Grind and polish excess Cap Wafer to meet device layer thickness target
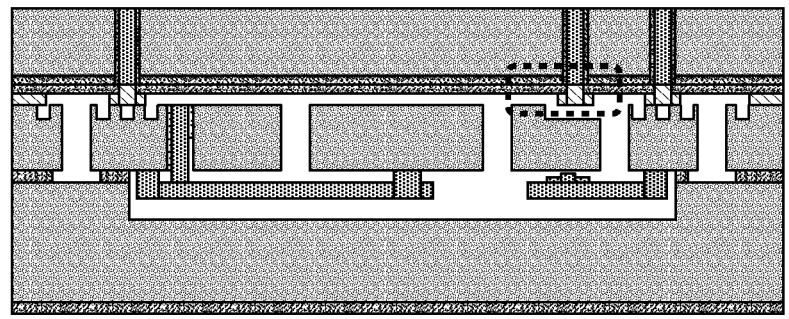
FIG. 4DD1

XYZ-axl
32. Deposit 1 um oxide film

33. LITHO 12 - CONTACT EXTERIOR SIDE: Pattern and etch oxide to open contacts to vias XYZ-axl 34. Deposit metal routing film 35. LITHO 13 - BOND PAD PLATING: Pattern to expose regions upon which to have bond pad metal plated XYZ-axl 36. LITHO 14 - METAL ROUTING EXTERIOR SIDE: Pattern and etch metal routing layer 37. Deposit SiO2/SiN passivation films XYZ-axl 38. LITHO 15 - PASSIVATION OPENING EXTERIOR SIDE: Pattern and etch openings in passivation films to access bond pads

SILICON  THICK OXIDE  POLYSILICON  METAL  SACRIFICAL OXIDE-1  PHOTORESIST

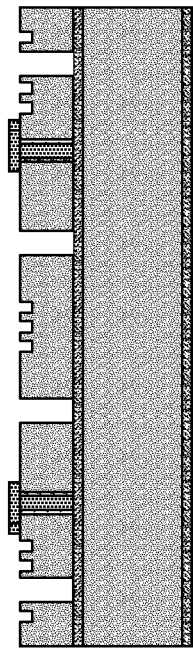
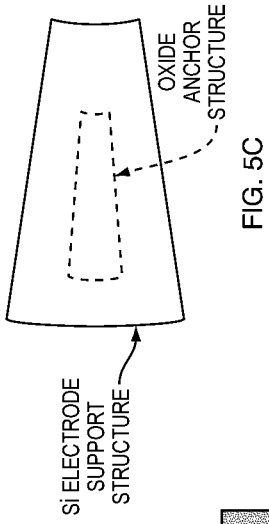
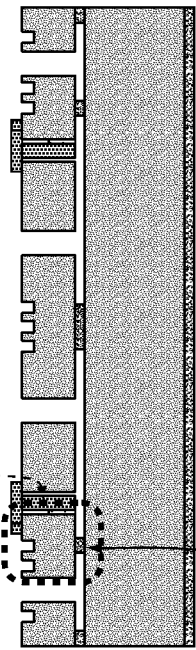
FIG. 5A
FIG. 5B
FIG. 5C

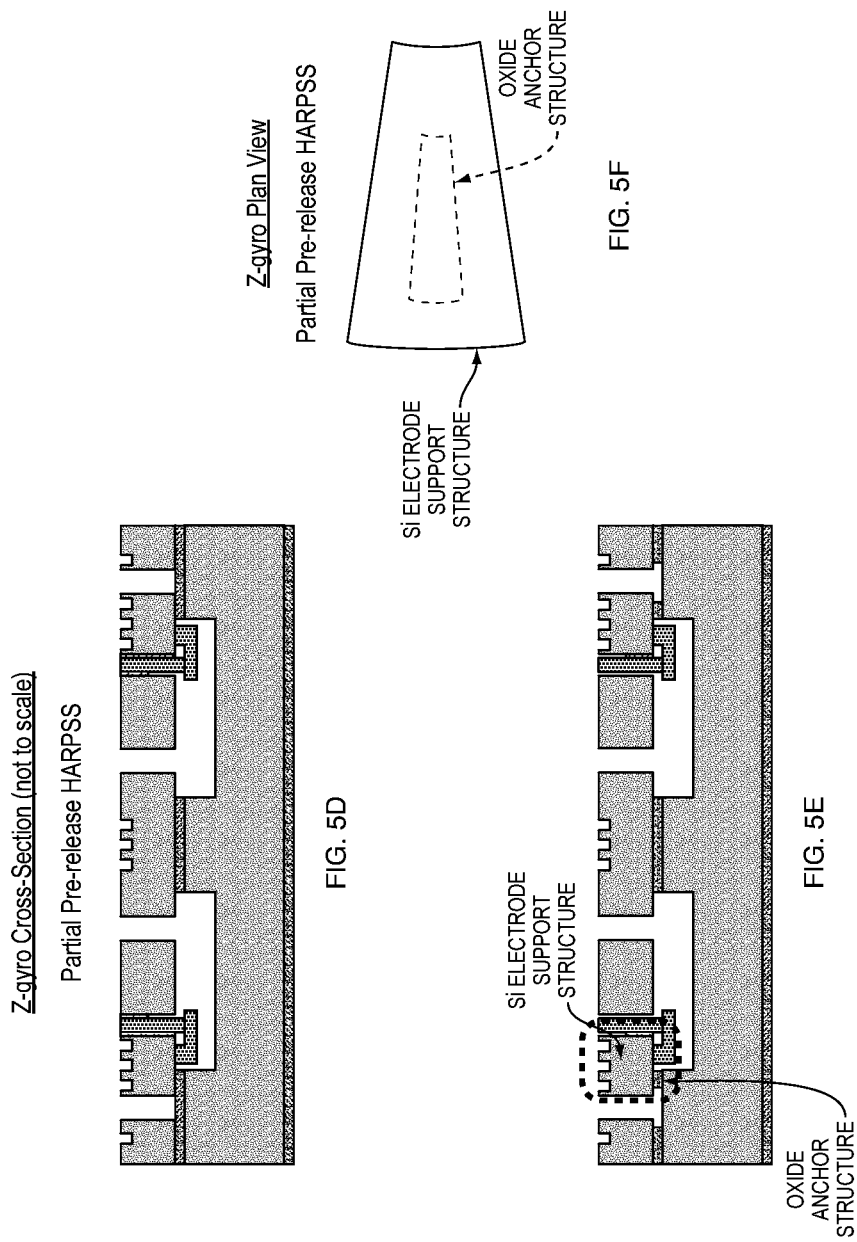

MEMS SENSOR

FIELD OF THE INVENTION

The disclosure relates to an alternate process for manufacturing inertial measurement devices that results in a reduction of size and cost of the manufactured product.

BACKGROUND OF THE INVENTION

Inertial measurement devices, such as gyroscopes and accelerometers, provide high-precision sensing, however, historically, their cost, size, and power requirements have prevented their widespread use in industries such as consumer products, gaming devices, automobiles, and handheld positioning systems.

More recently, micro-electro-mechanical systems (MEMS) devices, such as gyroscopes and accelerometers, have been gaining increased attention from multiple industries since micro-machining technologies have made fabrication of miniature gyroscopes and accelerometers possible. Miniaturization also enables integration of MEMS devices with readout electronics on the same die, resulting in reduced size, cost, and power consumption as well as improved resolution by reducing noise. Consumer products such as digital cameras, 3D gaming equipment, and automotive sensors are employing MEMS devices because of their numerous advantages. The demand for low cost, more sophisticated, and user-friendly devices by the consumers has caused a steep rise in the demand of MEMS sensors, as they offer adequate reliability and performance at very low prices.

State-of-the-art MEMS devices, such as those disclosed in U.S. Pat. Nos. 7,578,189; 7,892,876; 8,173,470; 8,372,67; 8,528,404; 7,543,496; and 8,166,816, are able to sense rotational (i.e. angle or angular velocity of rotation around an axis) or translational motion (i.e. linear acceleration along an axis) around and along axes. Techniques for manufacturing such devices using a process known as High Aspect Ratio Poly and Single Silicon (HARPSS) are disclosed in U.S. Pat. No. 7,023,065 entitled Capacitive Resonators and Methods of Fabrication by Ayazi, et al., and other publications.

The current monolithic HARPSS fabrication process requires significantly complex and difficult process steps to create all the features necessary for a multi-axis gyro and accelerometer sensor.

Accordingly, need exists for an improved manufacturing process which to eliminates the most costly and difficult elements in the manufacturing process.

A further need exists for an improved manufacturing process that enables device manufacturing costs to be lowered to a point that would be competitive for high volume consumer electronics products.

In addition, semiconductor manufacturing, especially microelectronics, utilize Silicon On Insulator (SOI) technology, i.e. the use of a layered silicon-insulator-silicon substrate in place of conventional silicon substrates to provide an selectively removable material layer (i.e. SiO2) below the mechanical device layer (i.e. Si) in order to fabricate a movable micro-mechanical element. However, such as SOI technology increases the cost and complexity of the semiconductor device manufacturing process.

Accordingly, need exists for an improved MEMS device manufacturing process which eliminates the need to utilize SOI manufacturing techniques while providing the same or better device yield and performance.

SUMMARY OF THE INVENTION

The disclosed semiconductor manufacturing process enables a complex multi-layer, hermetically-sealed wafer-level packaged MEMS, such as a gyroscope or accelerometer (AXL) to be formed without using Silicon On Insulator (SOI) substrates and obviates the need to purchase and use SOI wafers as starting materials. The disclosed techniques further allows the etching of the sacrificial oxide to be "head started" prior to fusion bonding, thereby reducing the amount of release etching required at the end of the MEMS wafer processing, enabling the size of the device to be reduced and additionally results in the ability to reduce the degree to which the final die size depends on the release process by allowing for a partial pre-release of the structure earlier in the integration flow. The disclosed techniques further simplifies the most critical deep reactive ion etch process and enables use of a thicker device layer. The thicker device layer facilitates designs capable of operating with higher-order modes for sensing so that multiple axes of rotation can be sensed by a single resonator mass.

According to one aspect of the disclosure, an inertial measurement MEMS semiconductor device is free of Silicon On Insulator (SOI) substrates.

According to another aspect of the disclosure, an inertial measurement MEMS semiconductor device comprises a first silicon wafer serving as a base and having a plurality of cavities formed in a surface thereof; a second silicon wafer, bonded to the first wafer, having a MEMS device architecture formed thereon; and a third silicon wafer serving as a cap to the device and having external electrical routing interfaces formed thereon.

According to yet another aspect of the disclosure, an inertial measurement MEMS semiconductor device comprises a first silicon wafer serving as a base and having a plurality of cavities formed in a surface thereof; a second silicon wafer, bonded to the first wafer, having a MEMS device layer formed thereon; and a third silicon wafer serving as a cap to the device and having external electrical routing interfaces formed thereon, and wherein a specific gap is formed between the second wafer and the third wafer such that out-of-plane electrodes are formed both above and below the MEMS device layer on the second wafer, to produce greater sensitivity to the desired motion of interest, and/or with reduced spurious signals.

According to still another aspect of the disclosure, an inertial measurement MEMS semiconductor device comprises a single resonator mass capable of sensing rotation about multiple axes of rotation.

According to yet another aspect of the disclosure, a method does not utilize Silicon On Insulator (SOI) substrates in the manufacturing an inertial measurement MEMS semiconductor device.

According to still another aspect of the disclosure, a method of manufacturing an inertial measurement MEMS semiconductor device enables the formation of out-of-plane electrodes both above and below the substrate on which the MEMS layer is implemented to allow for greater sensitivity to the desired motion of interest.

According to still another aspect of the disclosure, a method of manufacturing an inertial measurement MEMS semiconductor device enables etching of sacrificial oxide to be performed prior to fusion bonding of the various substrate layers comprising the semiconductor device, thereby reducing the amount of release etching required at the end of the MEMS wafer processing, enabling the size of the device to be reduced.

BRIEF DESCRIPTION OF THE DRAWINGS

The present disclosure is illustratively shown and described in reference to the accompanying drawing in which:

FIGS. 2A-2KK are conceptual cross-sectional representations of steps for fabricating the device shown in FIG. 1A in accordance with the present disclosure while FIGS. 2Q1 and 2Q2 illustrate variations of process step 18, FIG. 2S1 illustrates a variation of process step 20, and FIG. 2DD1 illustrates a variation of process step 31;

FIGS. 3A-3KK are conceptual cross-sectional representations of steps for fabricating the device shown in FIG. 1B in accordance with the present disclosure while FIGS. 3Q1 and 3Q2 illustrate a variation of process step 18, FIG. 3S1 illustrates a variation of process step 20, and FIG. 3DD1 illustrates a variation of process step 31;

FIGS. 4A-4KK are conceptual cross-sectional representations of steps for fabricating the device shown in FIG. 1C in accordance with the present disclosure while FIGS. 4Q1 and 4Q2 illustrate variations of process step 18, FIG. 4S1 illustrates a variation of process step 20, and FIG. 4DD1 illustrates a variation of process step 31;

FIGS. 5A-5B are conceptual cross-sectional representations of conventional HARPSS electrode support undercut;

FIG. 5C is conceptual top view representations of conventional HARPSS electrode support undercut of FIG. 5B illustrating the relationship of the electrode support structure relative to the oxide anchor structure, illustrated in phantom;

FIGS. 5D-5E are conceptual cross-sectional representations of the electrode support undercut in accordance with the present disclosure;

FIG. 5F is conceptual top view representations of an electrode support undercut of FIG. 5E illustrating the relationship of the electrode support structure relative to the oxide anchor structure, illustrated in phantom, in accordance with the present disclosure;

DETAILED DESCRIPTION

The present disclosure will be more completely understood through the following description, which should be read in conjunction with the drawings. The skilled artisan will readily appreciate that the methods, apparatus and systems described herein are merely exemplary and that variations can be made without departing from the spirit and scope of the disclosure.

Technologies disclosed herein are directed towards sensing rotation and acceleration around all three axes of free space using an inertial measurement MEMS device. Such devices may have six degrees of freedom in their mechanical design to be able to sense six independent motion signals, i.e. linear acceleration along and angular velocity signals around three orthogonal axes of free space. The manufacturing techniques and designs disclosed herein may be used with any number of commercially available MEMS gyroscopes including those disclosed in the previously mentioned U.S. Pat. No. 7,023,065 United States Patent Application Publication 2012/0227,487, and United States Patent Application Publication 2012/0227,487, the subject matter of which is incorporated herein by this reference for all purposes.

Disclosed herein is a manufacturing process for making MEMS gyroscopes and accelerometers incorporating the high-aspect ratio narrow sense gaps produced by the HARPSS process without the use of SOI as a starting material. To achieve this result in accordance with the disclosed improved manufacturing process, three silicon wafers are used—a first wafer to form a base with cavities in a surface thereof; a second wafer in which the MEMS layer is formed and which is bonded to the first wafer, using for example a fusion bonding before being thinned to the desired layer thickness, and a third wafer to cap the device including electrical routing interfaces to the outside world, whether Through-Silicon Vias (TSVs), lateral feedthroughs, or a CMOS circuitry wafer.

Figure 1A:
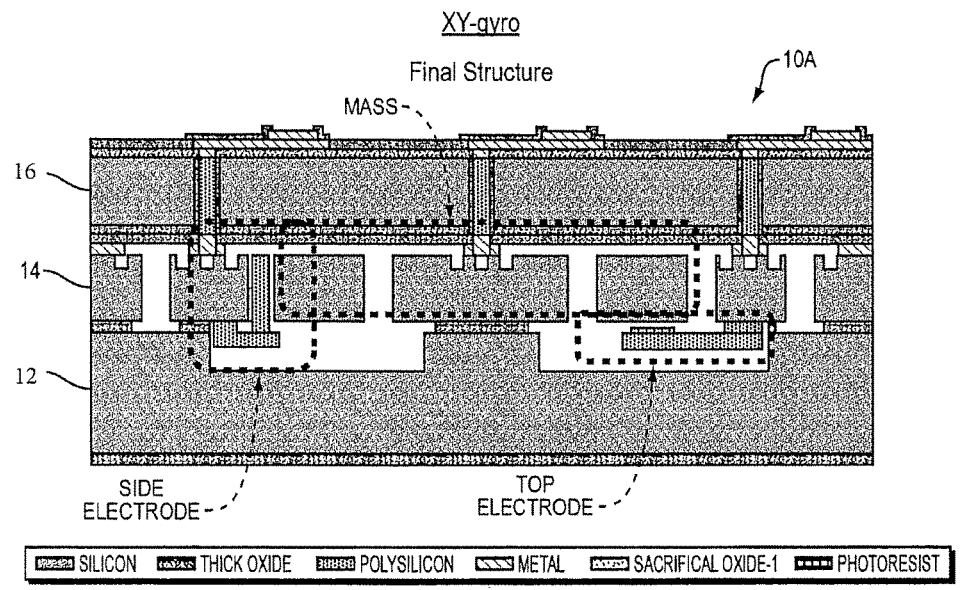
FIG. 1A illustrates conceptually a cross-sectional view of an X-axis gyroscope or a Y-axis gyroscope in accordance with the present disclosure.

Referring now to FIG. 1A an inertial measurement MEMS device 10A is shown in accordance with the present disclosure. MEMS device 10A comprises a first wafer 12 serving as a base with cavities, a second wafer 14 bonded to the first wafer 12 and on which the MEMS device is implemented, and a third wafer 16 serving as the cap to the device 10A. Devices 10B and 10C of FIGS. 1B and 1C, respectively, similarly comprise wafers 12, 14 and 16.

By inverting the structure of device 10, the connections to the side electrodes, the out-of-plane conventional top electrodes, and any tethers to the proof masses of the HARPSS-based inertial sensors are formed on the bottom of the second substrate, i.e. the MEMS or device wafer 14, within the cavities formed in the first substrate 12. The disclosed process enables the production of electrode support structures, i.e. the portions of the second substrate that the poly electrodes are attached to, which have oxide anchors to the first substrate which can be <15 um smaller than the electrode support structure itself. Conventional manufacturing approaches require a greater amount of release etching (which is not true of the disclosed process due to the ability to pre-etch the conformal oxide between the side electrodes and the resonator, in the case of a gyroscope, or proof mass structures, in the case of an accelerometer) resulting in the oxide anchors being much smaller than the electrode support structure, e.g. on the scale of 20 um smaller or more. The ability to produce electrode support structures and oxide anchors that are more closely matched in area enable the final area of the device die containing the MEMS device to be smaller and for the electrode support structures to be more robustly connected to the first substrate, improving the reliability of the device 10.

Figure 6A:
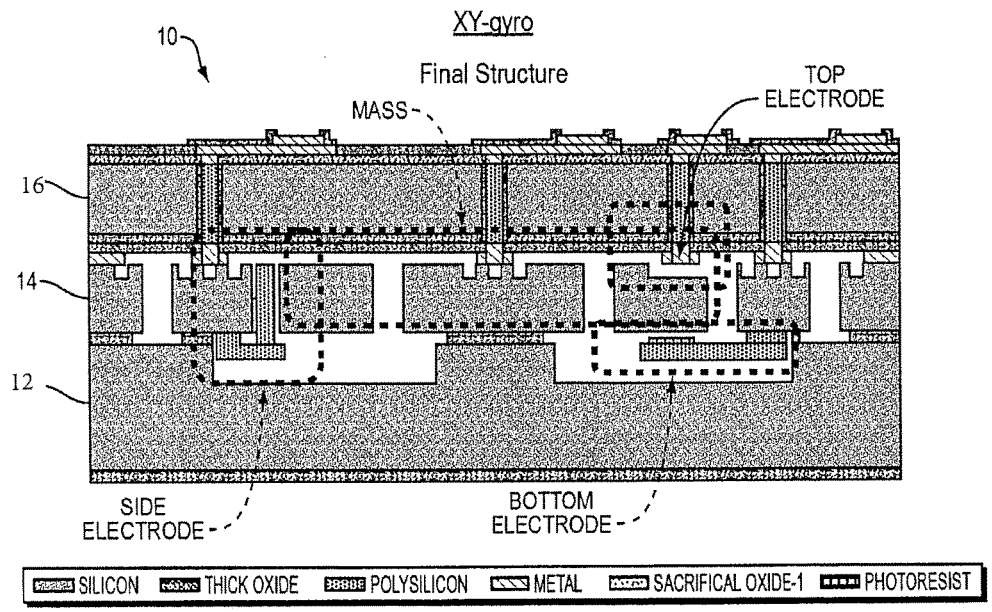
FIG. 6A illustrates conceptually a cross-sectional view of an X-axis gyroscope or a Y-axis gyroscope illustrating electrode configurations in accordance with another embodiment the present disclosure.
Figure 6B:
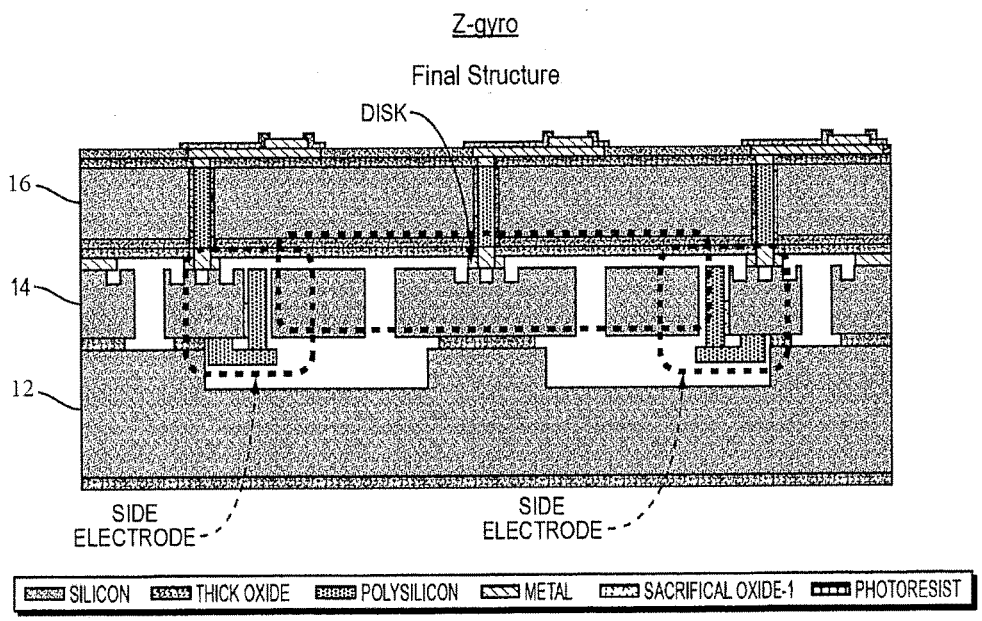
FIG. 6B illustrates conceptually a cross-sectional view of a Z-axis gyroscope illustrating electrode configurations in accordance with another embodiment the present disclosure.
Figure 6C:
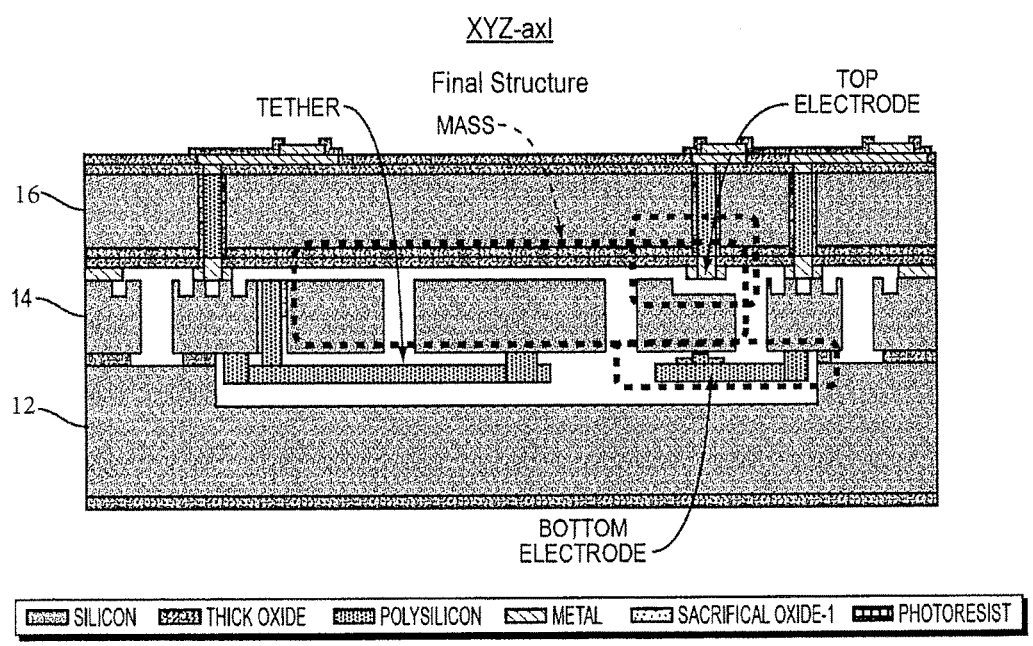
FIG. 6C illustrates conceptually a cross-sectional view of an XYZ accelerometer illustrating electrode configurations in accordance with another embodiment the present disclosure.

Another advantageous structure that can be formed by the disclosed process flow, is the partial etch on the upper surface of the second substrate layer, after it is bonded to the first substrate and thinned, to form a specific gap between the second substrate and the third substrate such that out-of-plane electrodes may also be formed on the top surface of the second substrate, in addition to those formed on the bottom surface of the second substrate, as illustrated in FIGS. 6A and 6C. By allowing the formation of out-of-plane electrodes both above and below the second substrate MEMS layer, x-axis or y-axis gyroscopes or accelerometer designs can be produced with greater sensitivity to the desired motion of interest, or with reduced spurious signals. In embodiments, the MEMS semiconductor apparatus further comprises at least one in-plane electrode formed in the same plane as the substrate on which the MEMS device layer is formed.

Additionally, partial etching of the upper surface of the second substrate allows the second substrate to be selectively thinned, which allows MEMS features, e.g. resonators for gyroscopes, proof masses for accelerometers, flexures or tethers, to be formed with different thickness values, even within the same device die. This unique feature enables the design of each device functionality, e.g. accelerometer versus gyroscope, to be better optimized to its own performance targets while still being monolithically formed in one multi-functional MEMS device die.

Figure 1B:
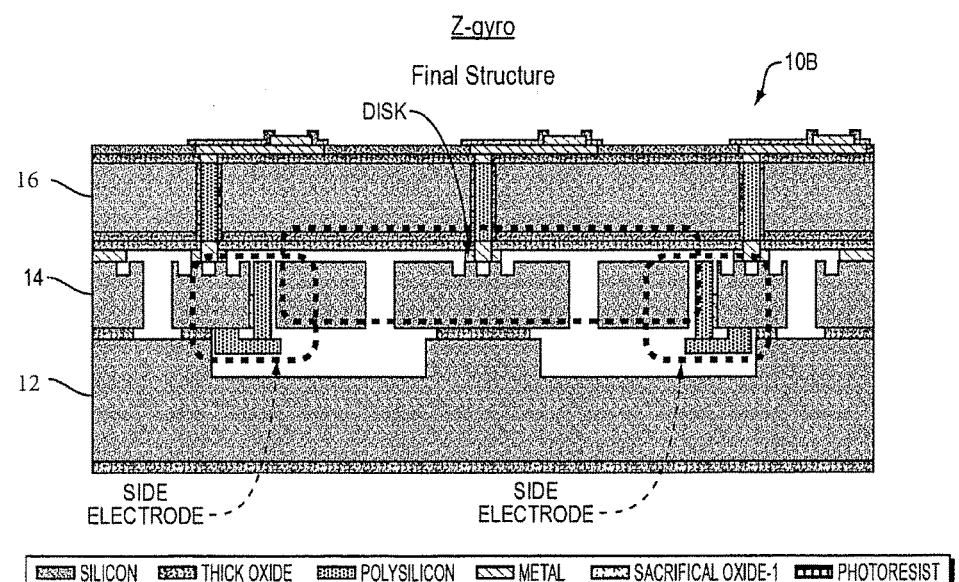
FIG. 1B illustrates conceptually a cross-sectional view of a Z-axis gyroscope in accordance with the present disclosure.
Figure 1C:
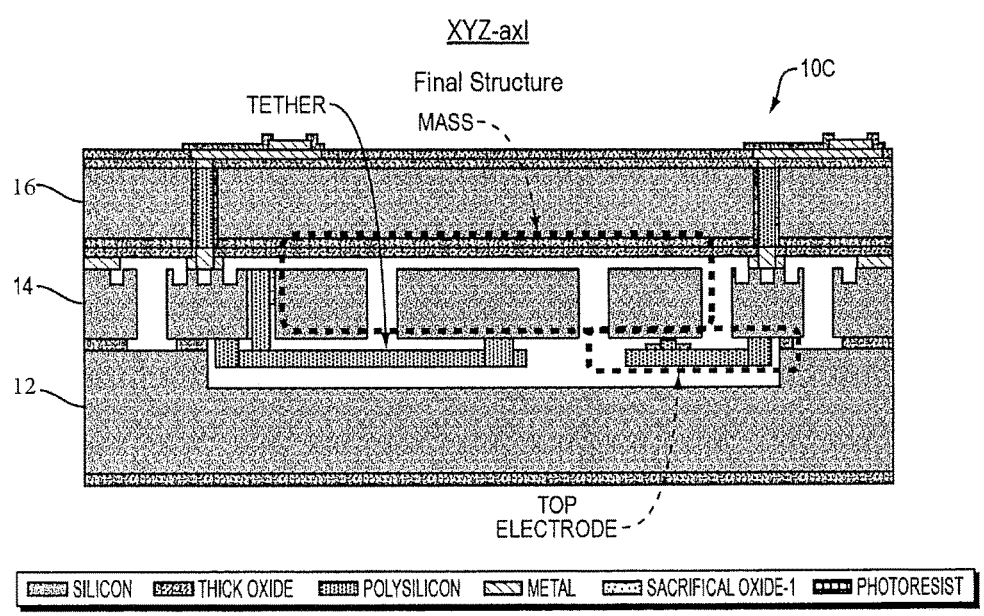
FIG. 1C illustrates conceptually a cross-sectional view of an XYZ accelerometer in accordance with the present disclosure.
Figure 2A:
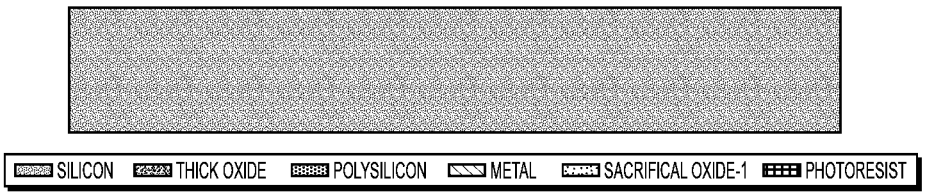
Figure 2B:
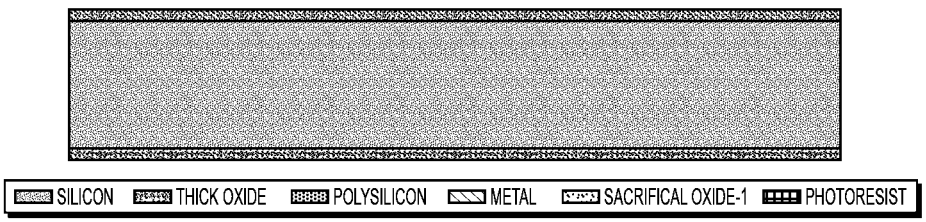
Figure 2C:
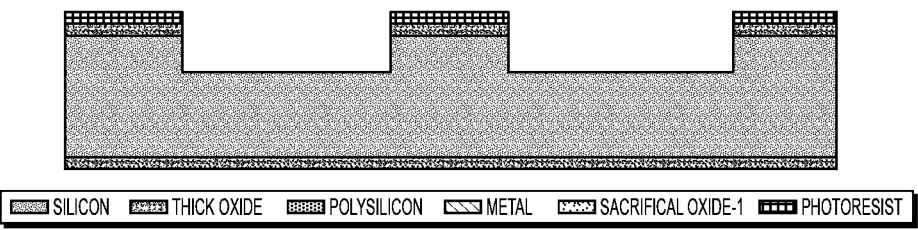
Figure 2D:
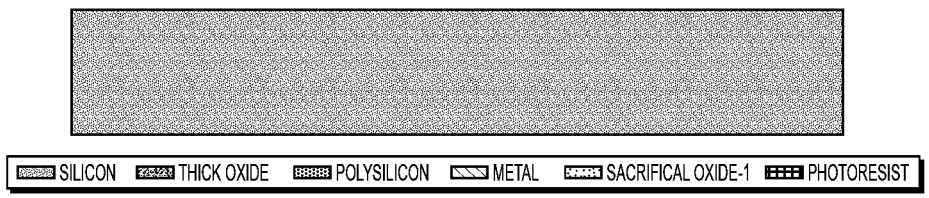
Figure 2E:
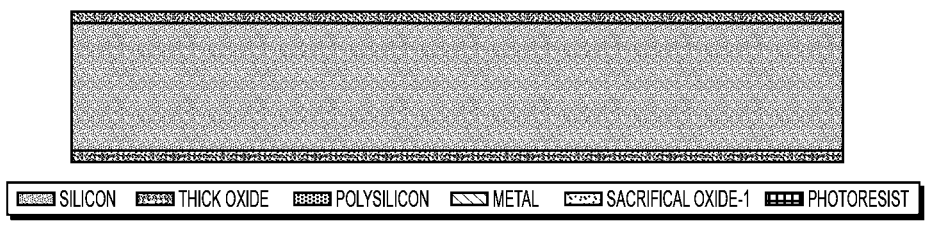
Figure 2F:
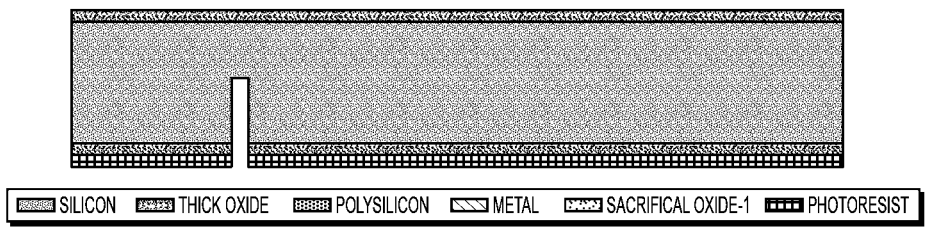
Figure 2G:
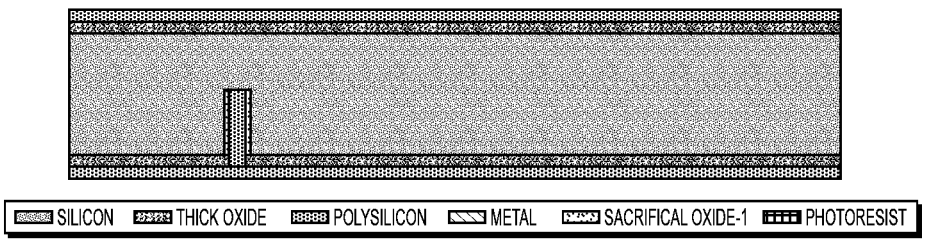
Figure 2H:
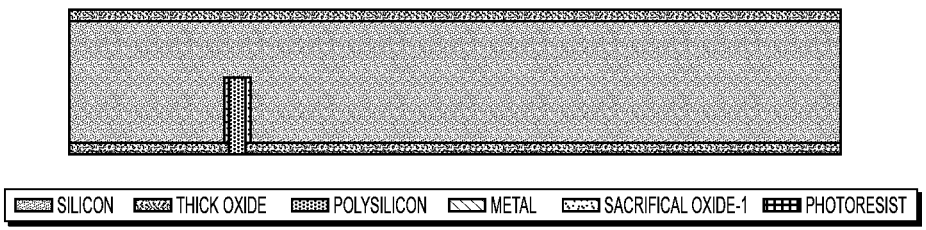
Figure 2I:
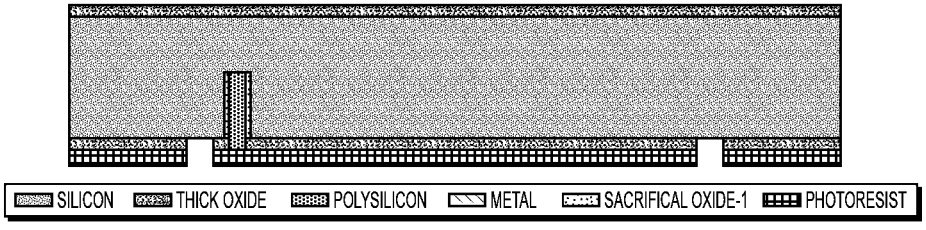
Figure 2J:
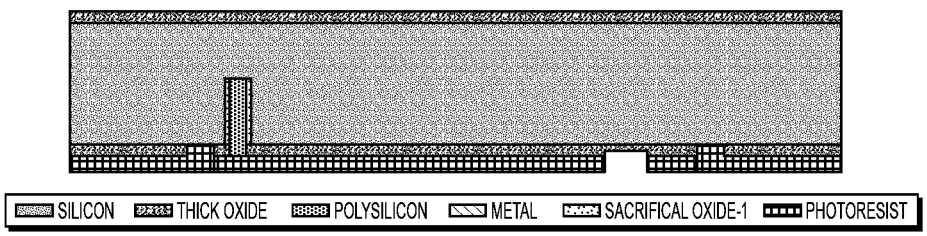
Figure 2K:
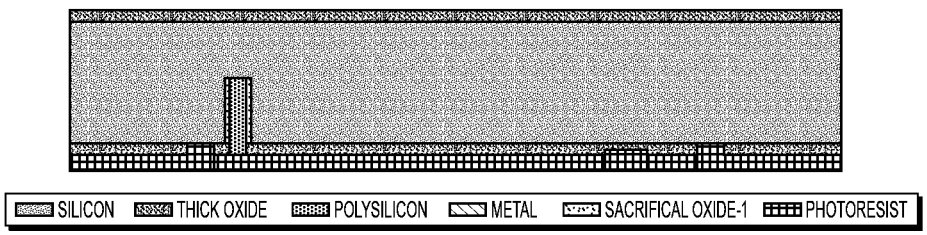
Figure 2L:
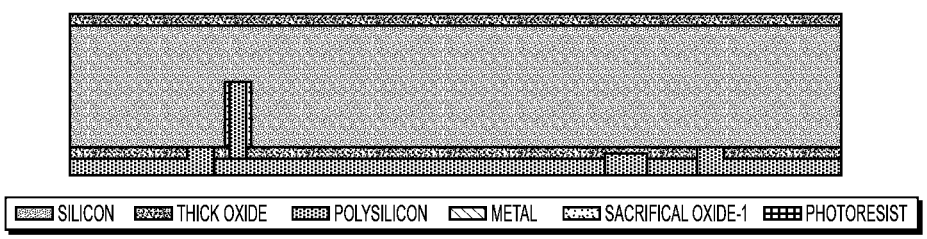
Figure 2M:
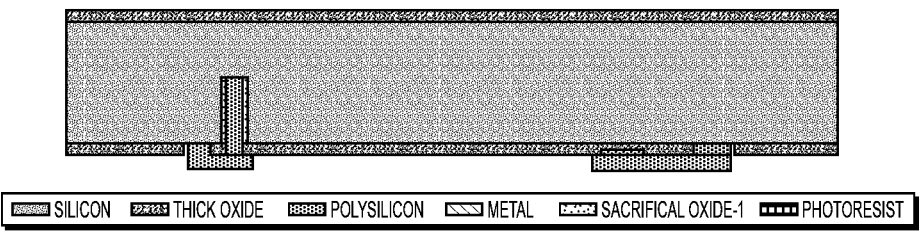
Figure 2N:
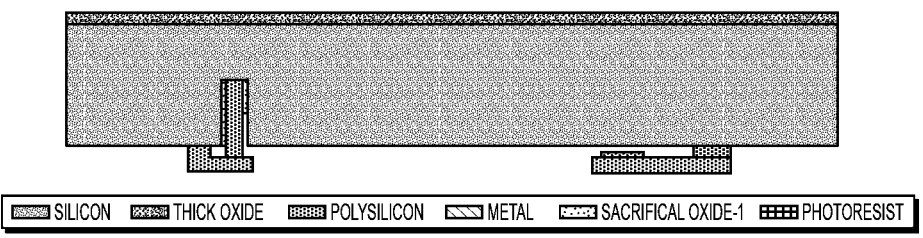
Figure 2O:
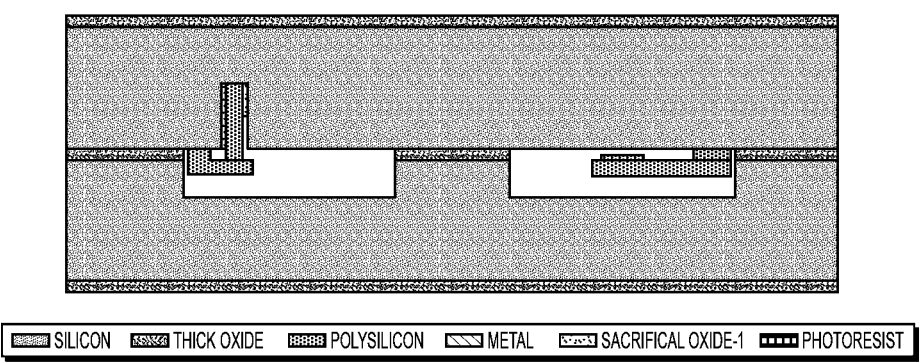
Figure 2R:
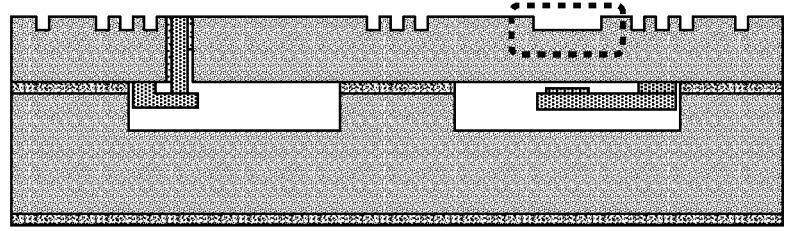
Figure 2R:
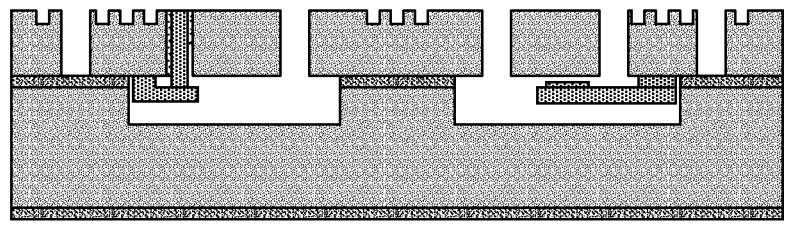
Figure 2S:
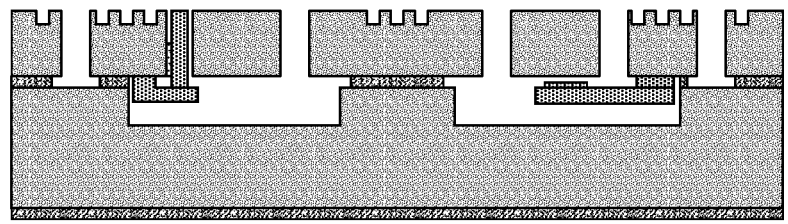
Figure 2T:
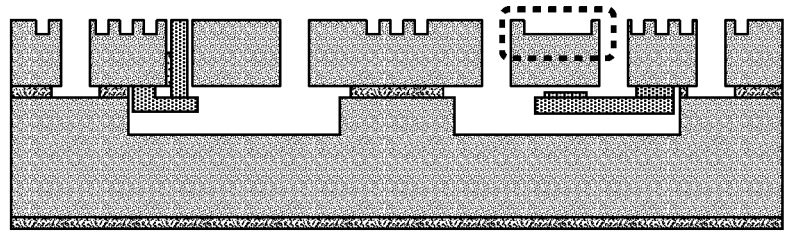
Figure 2T:
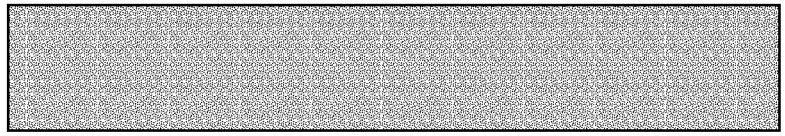
Figure 2U:
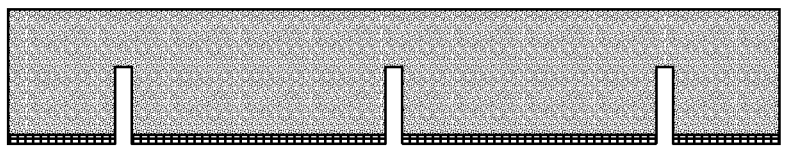
Figure 2V:
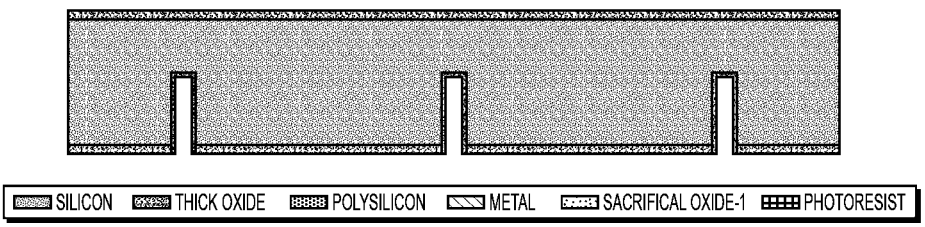
Figure 2W:
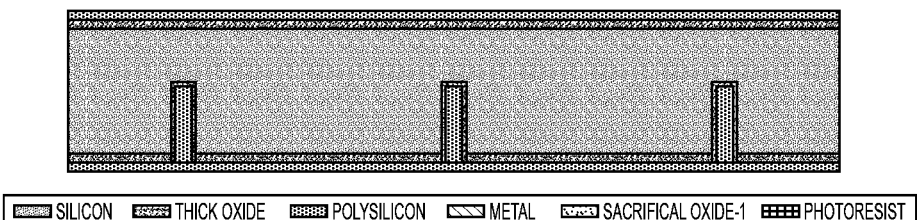
Figure 2X:
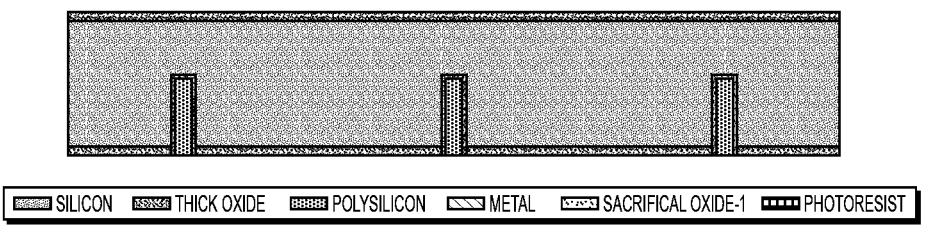
Figure 2Y:
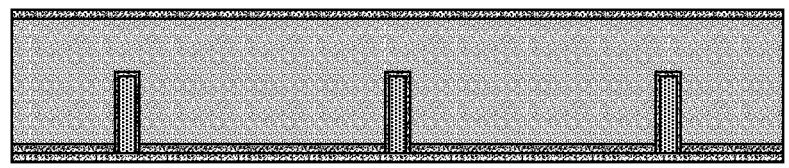
Figure 2Z:
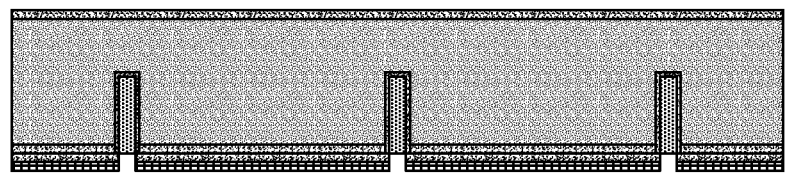
Figure 2A:
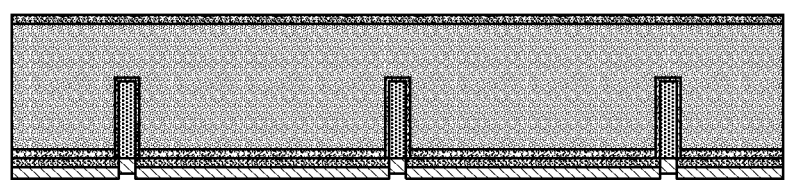
Figure 2B:
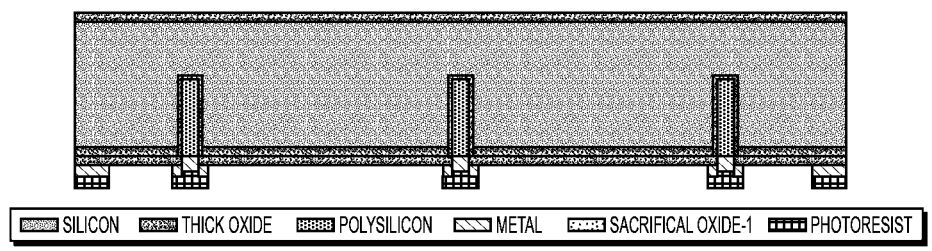
Figure 2C:
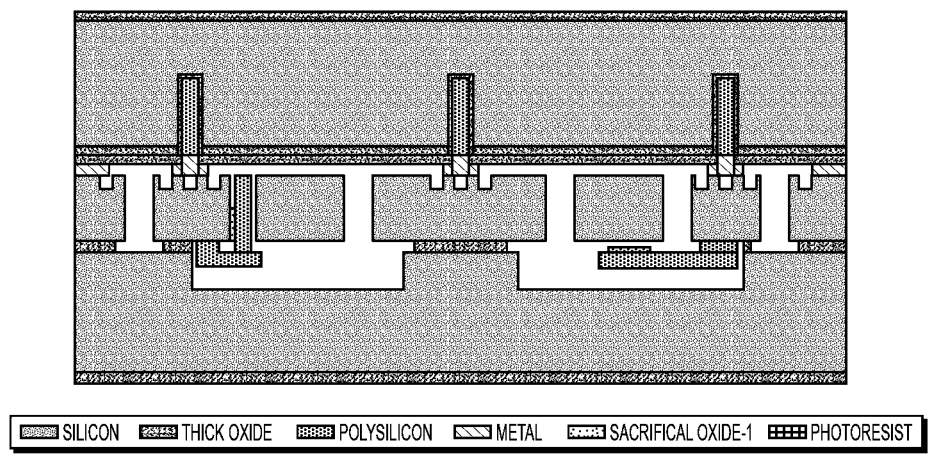
Figure 2E:
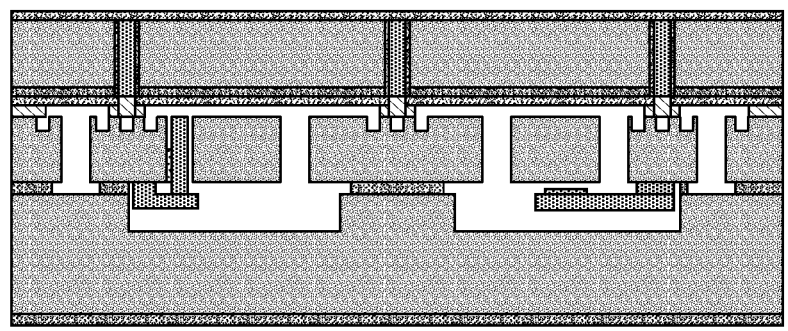
Figure 2F:
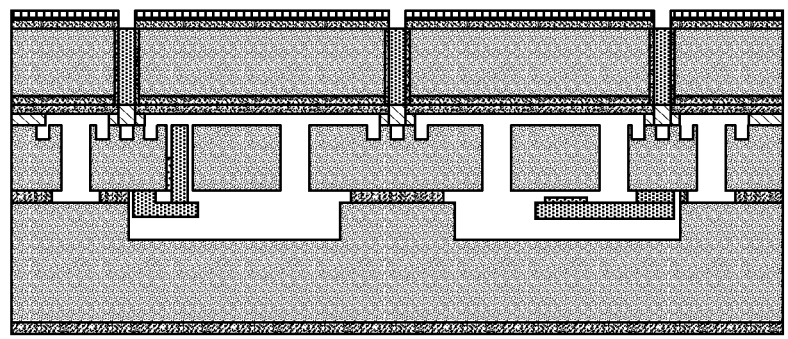
Figure 2G:
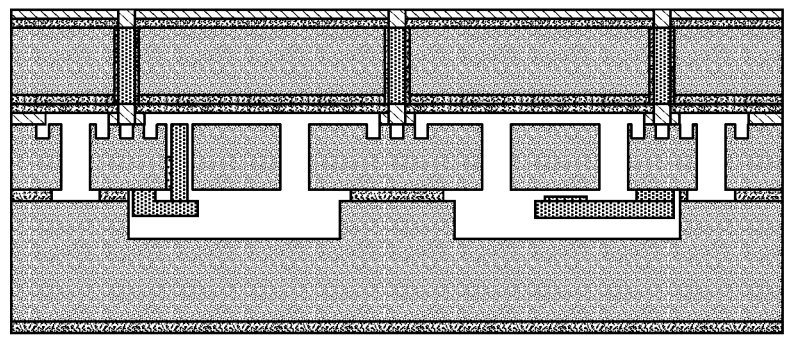
Figure 2H:
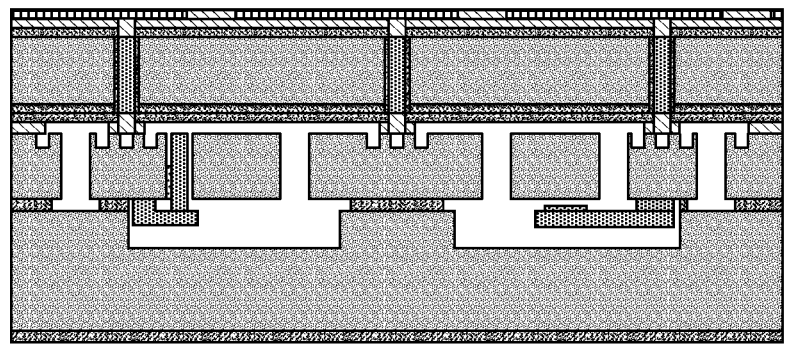
Figure 2I:
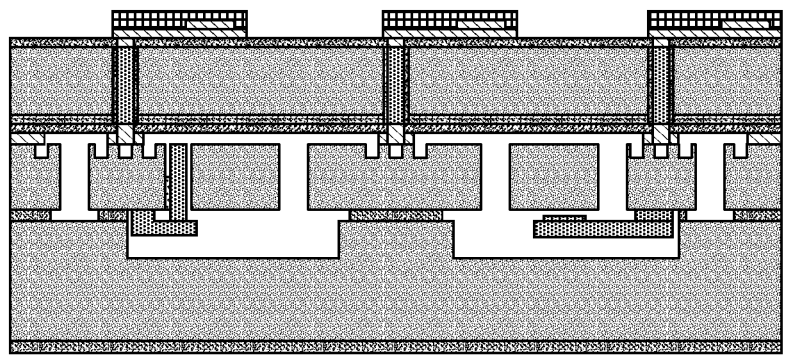
Figure 2J:
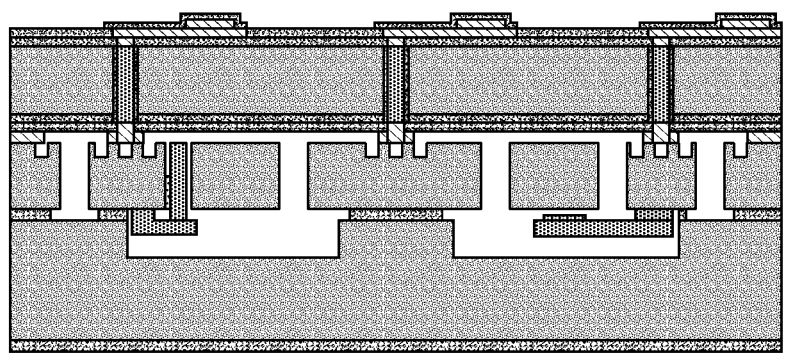
Figure 2K:
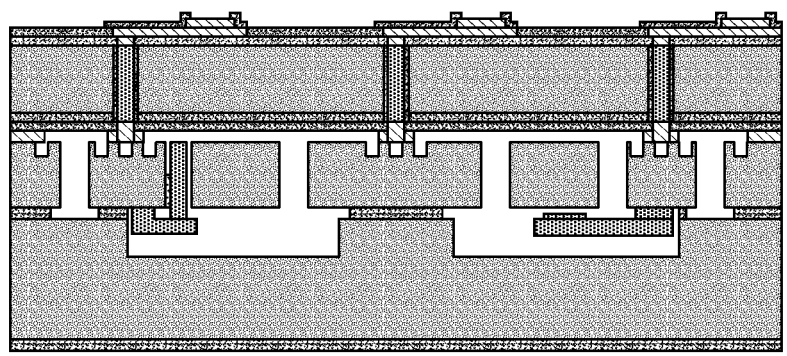
Figure 3A:
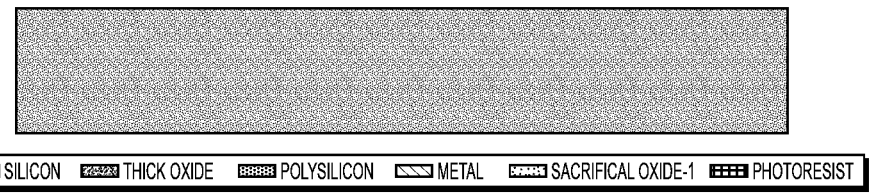
Figure 3B:
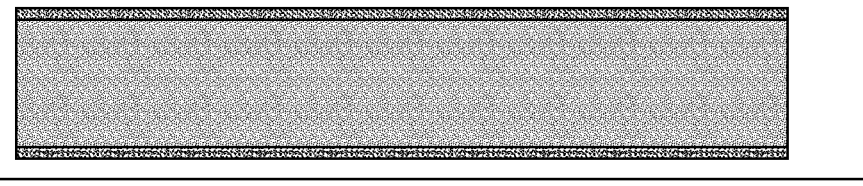
Figure 3C:
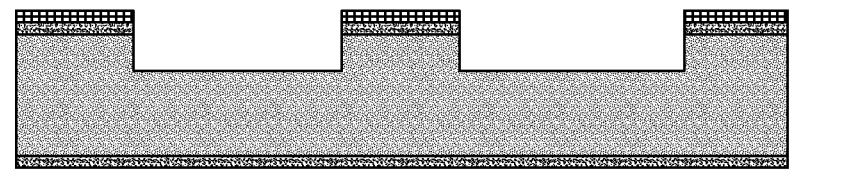
Figure 3D:
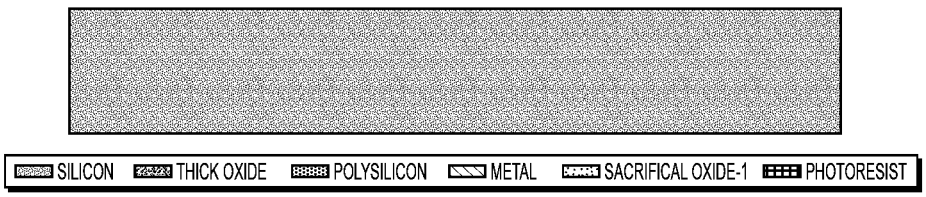
Figure 3E:
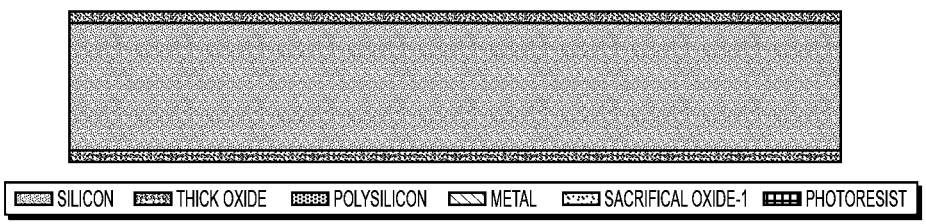
Figure 3F:
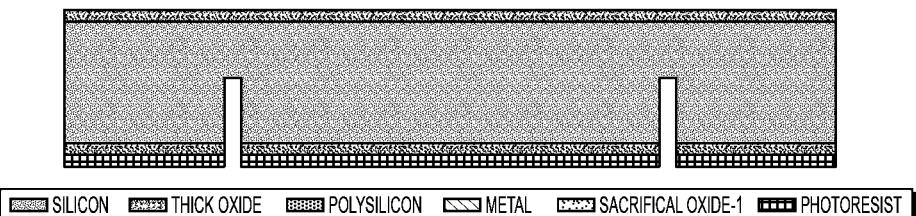
Figure 3G:
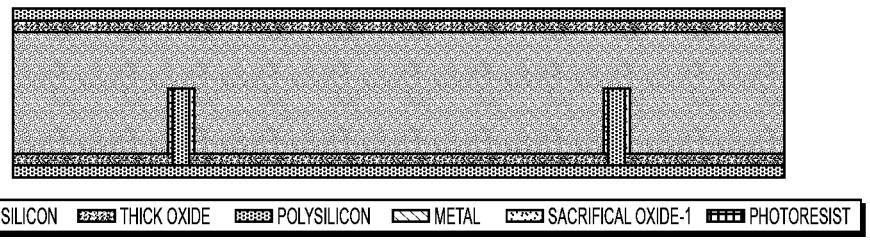
Figure 3H:
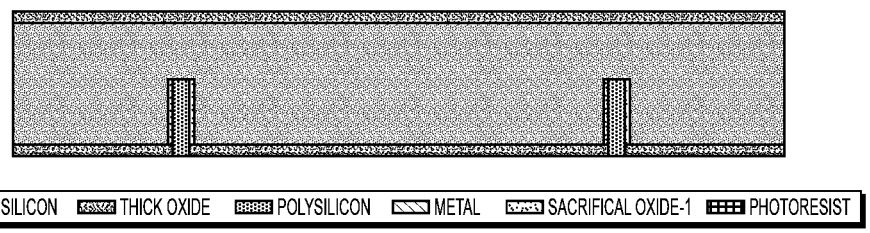
Figure 3I:
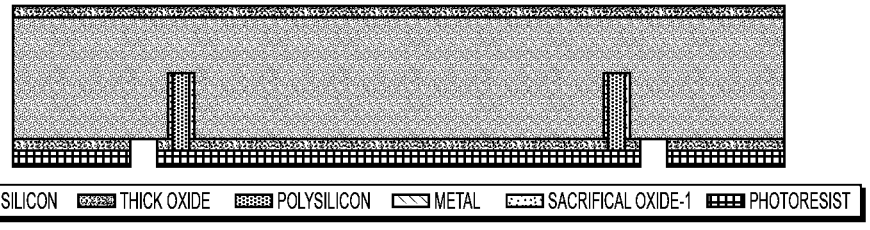
Figure 3J:
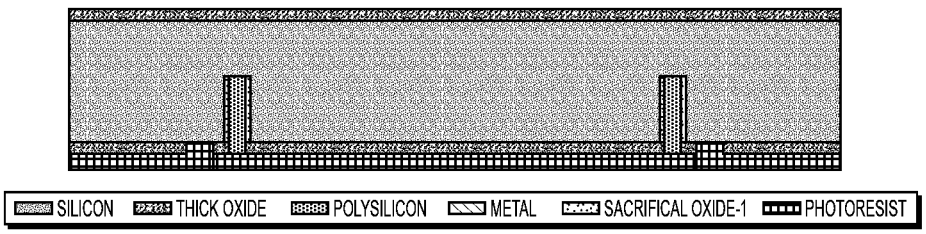
Figure 3K:
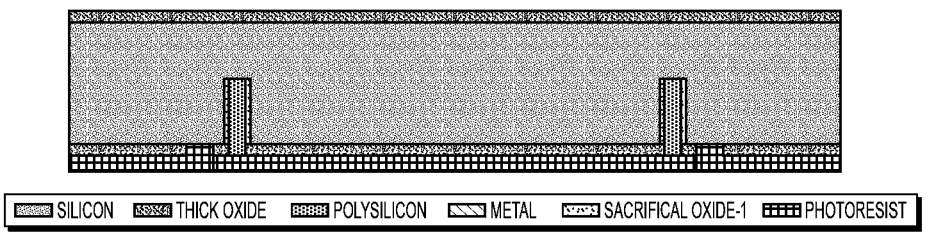
Figure 3L:
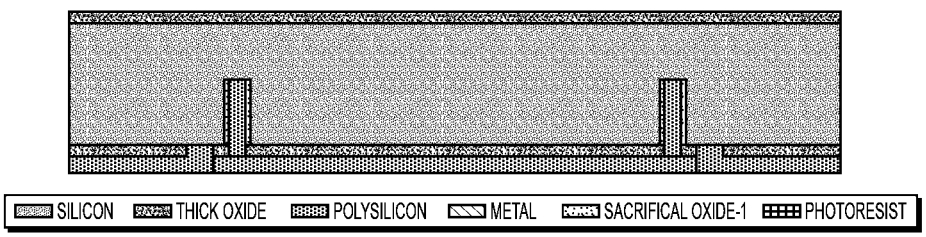
Figure 3M:
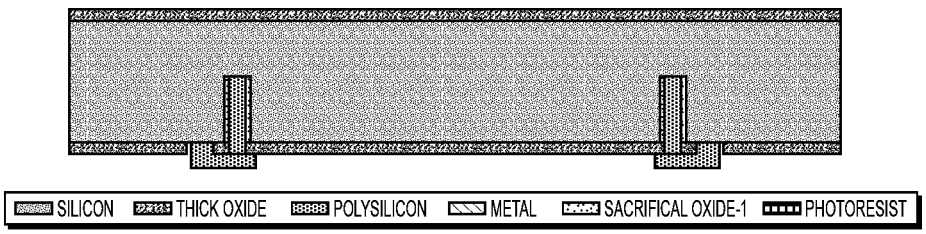
Figure 3N:
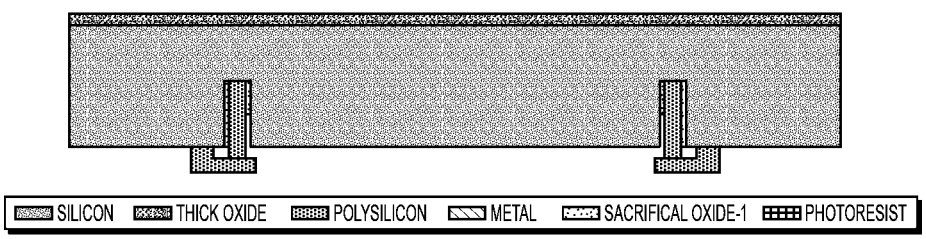
Figure 3O:
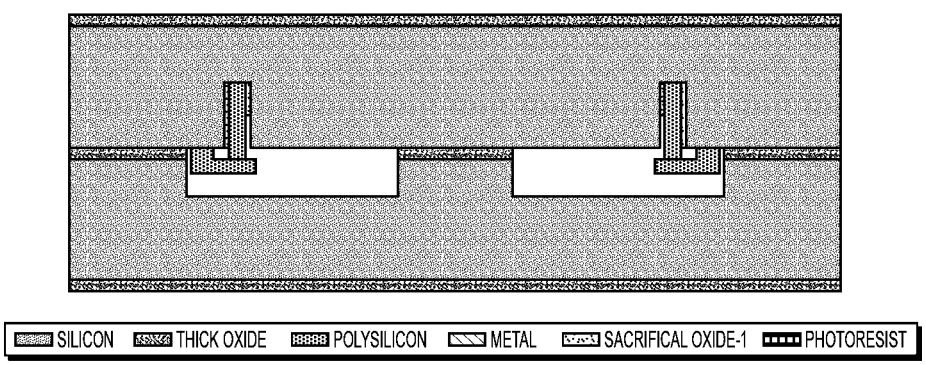
Figure 3R:
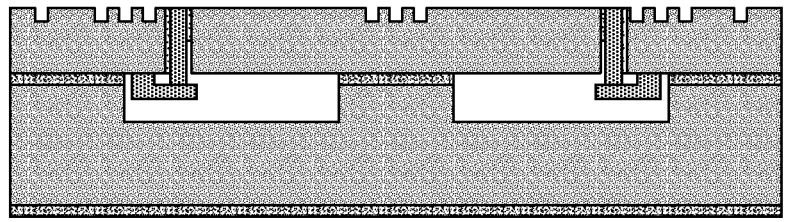
Figure 3R:
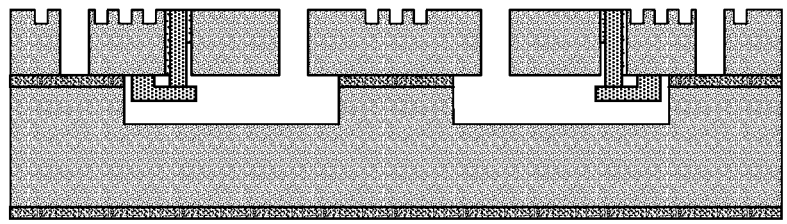
Figure 3S:
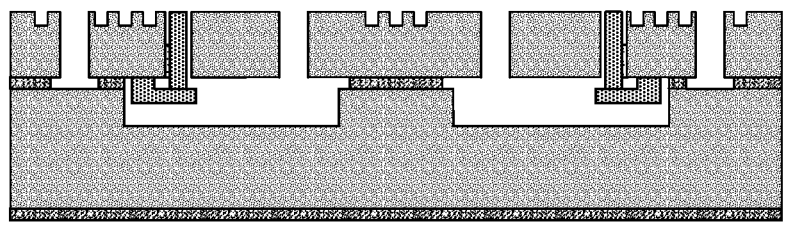
Figure 3T:
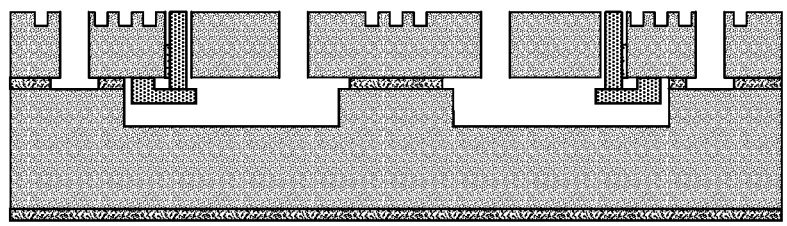
Figure 3T:
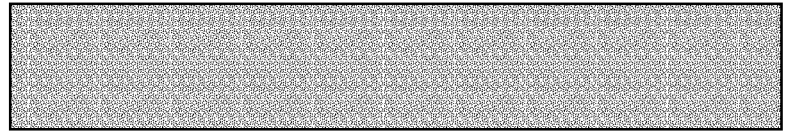
Figure 3U:
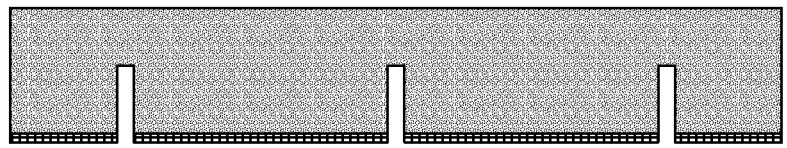
Figure 3V:
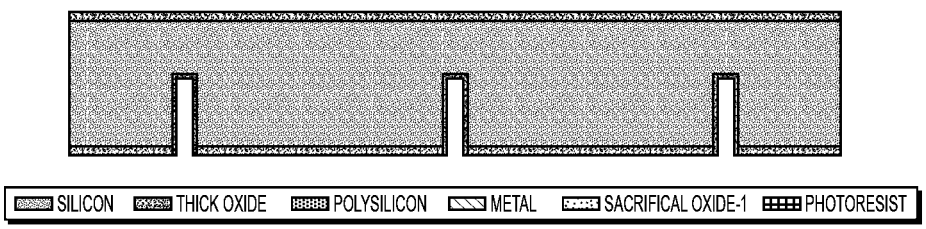
Figure 3W:
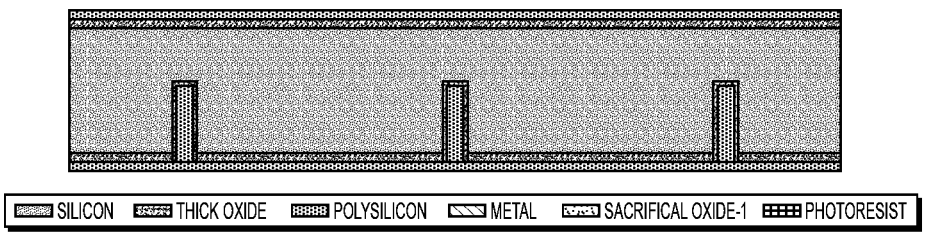
Figure 3X:
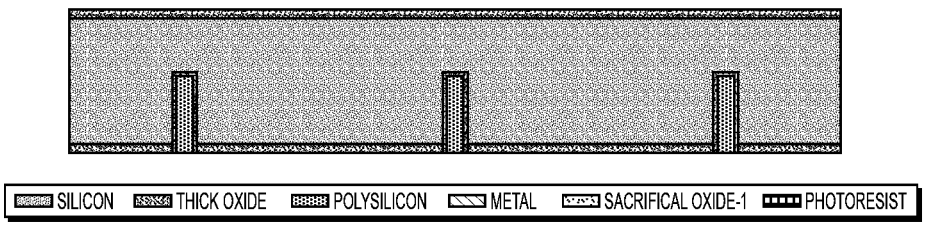
Figure 3Y:
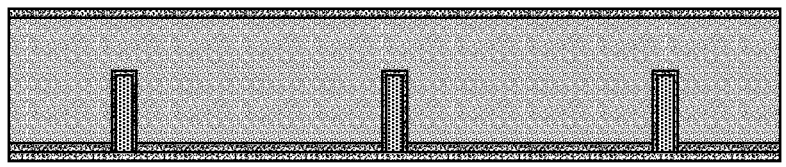
Figure 3Z:
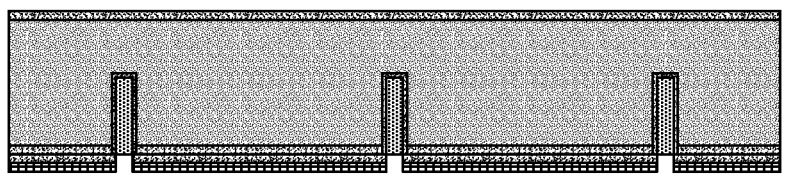
Figure 3A:
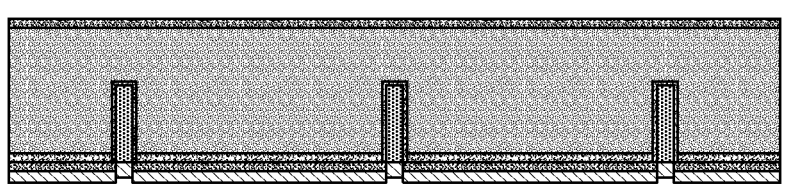
Figure 3B:
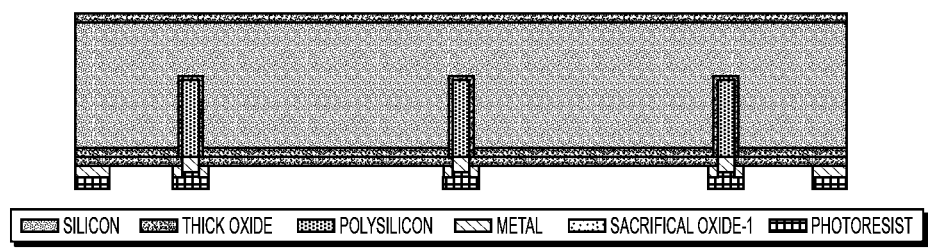
Figure 3C:
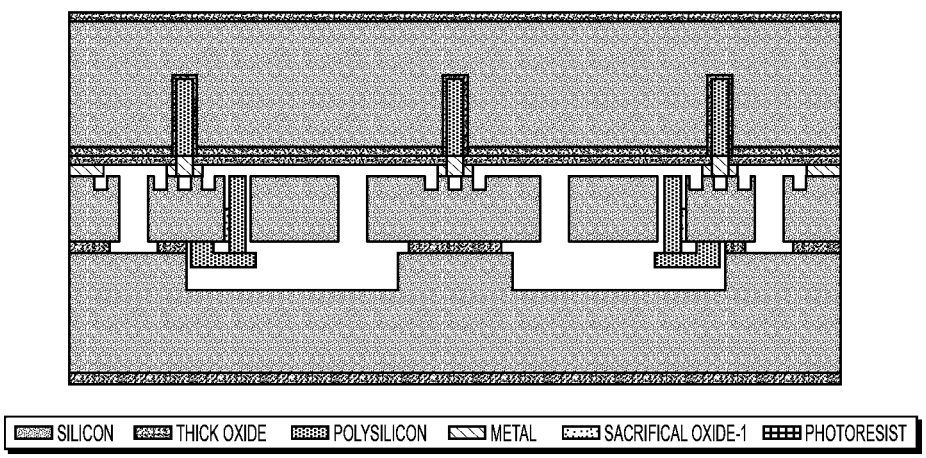
Figure 3E:
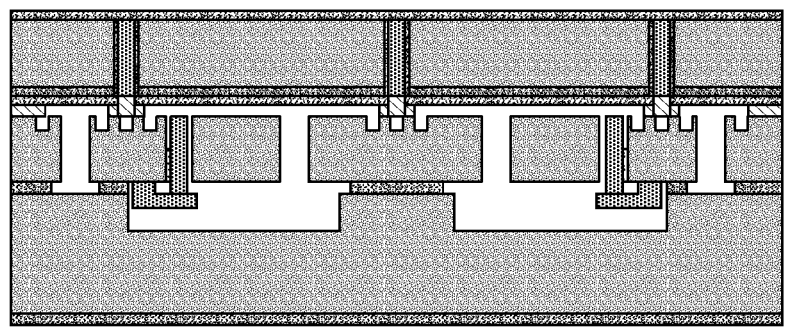
Figure 3F:
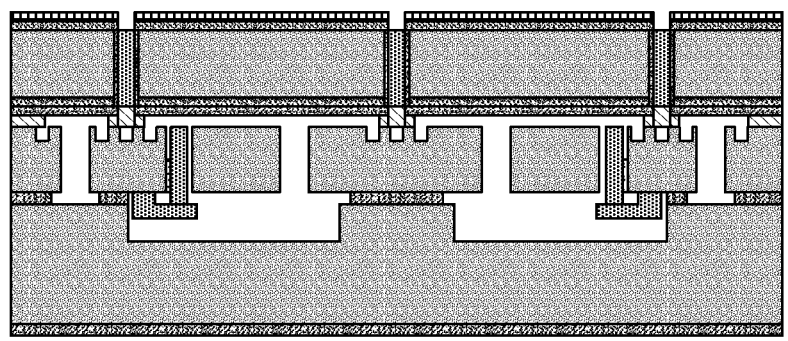
Figure 3G:
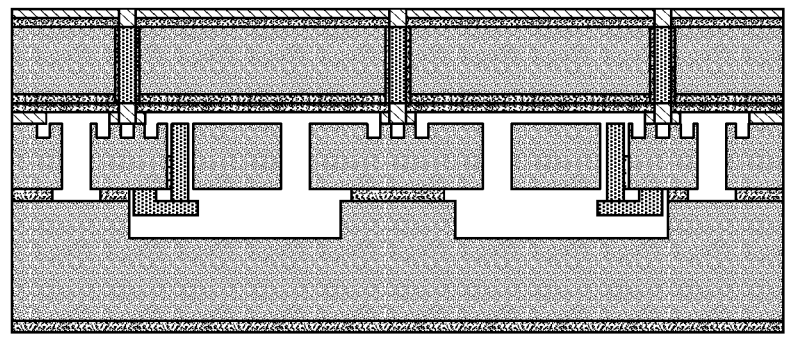
Figure 3H:
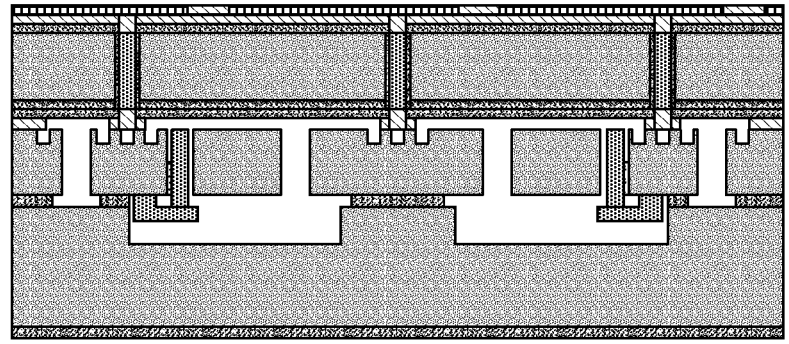
Figure 3I:
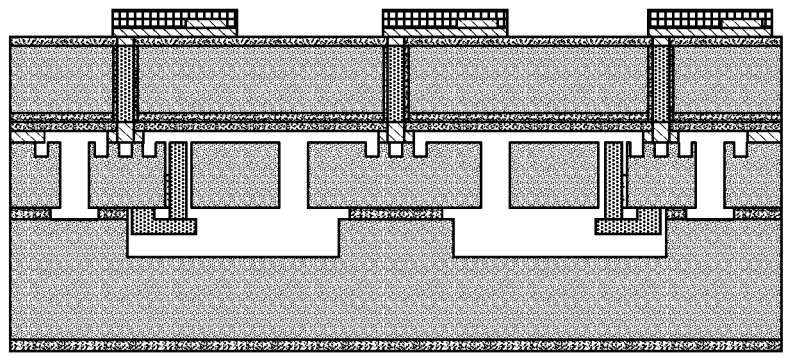
Figure 3J:
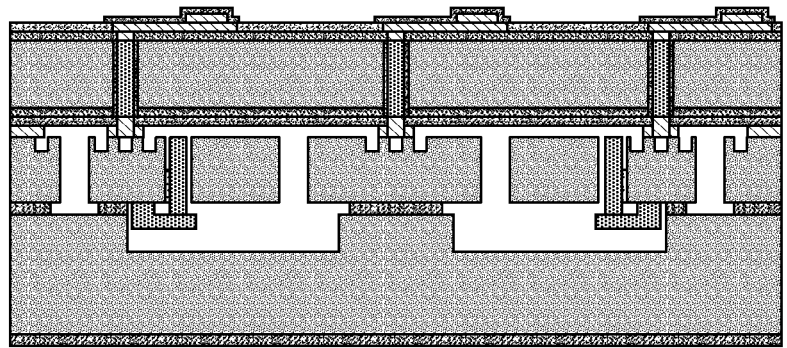
Figure 3K:
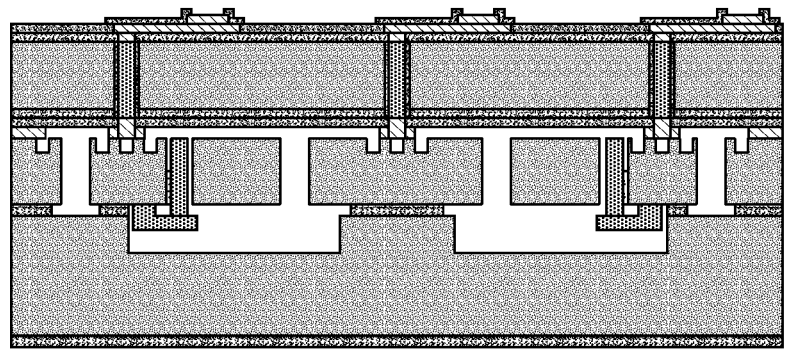
Figure 4A:
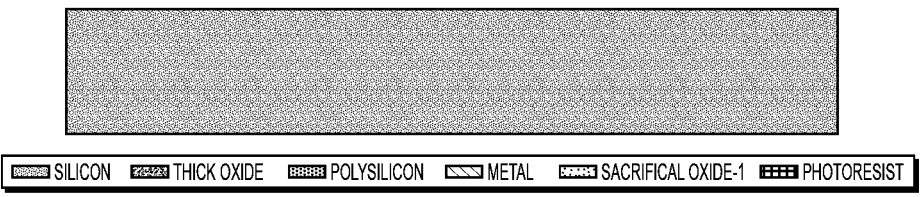
Figure 4B:
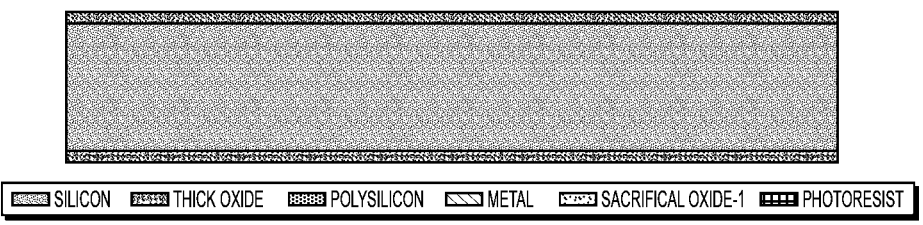
Figure 4C:
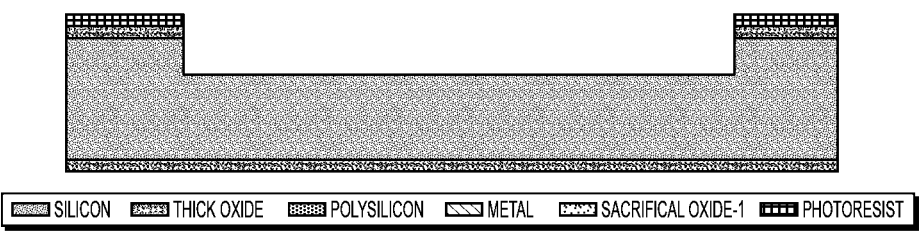
Figure 4D:
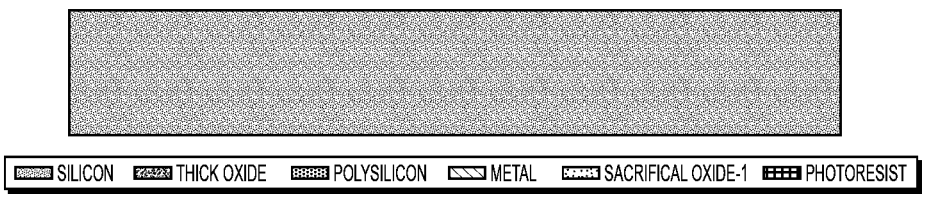
Figure 4E:
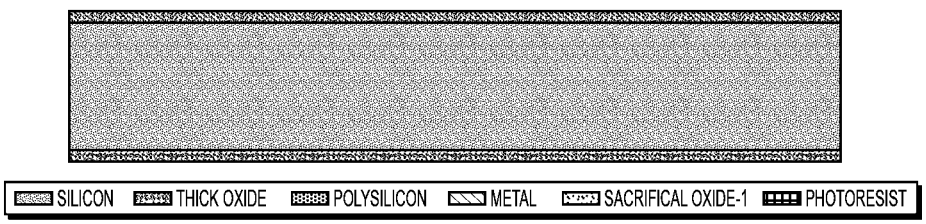
Figure 4F:
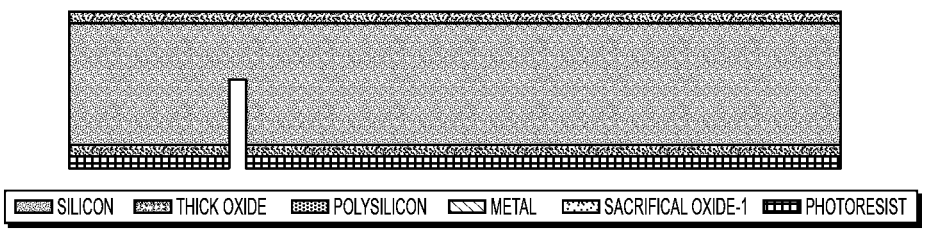
Figure 4G:
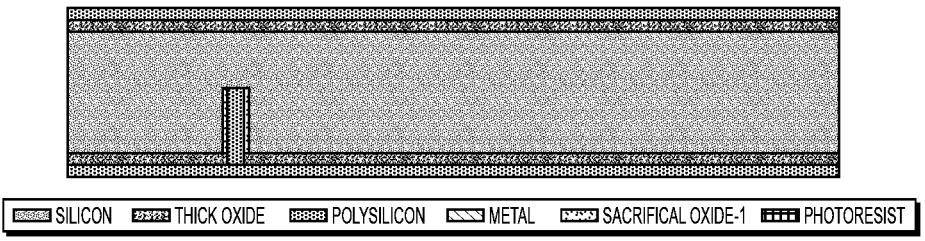
Figure 4H:
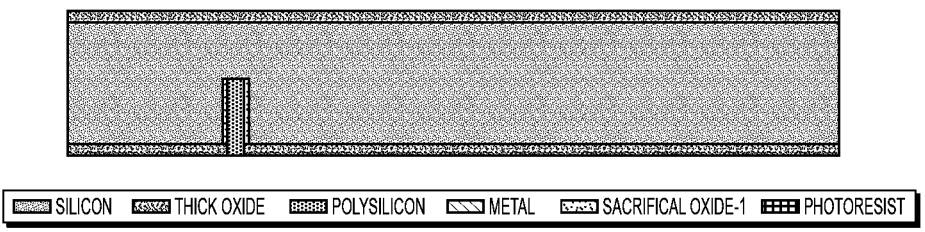
Figure 4I:
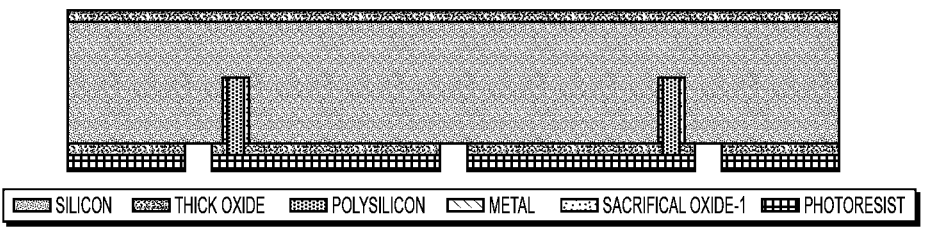
Figure 4J:
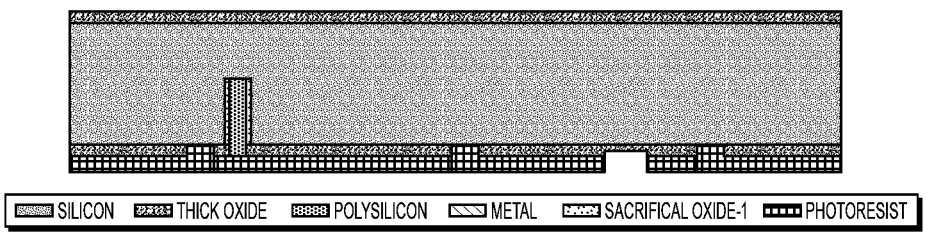
Figure 4K:
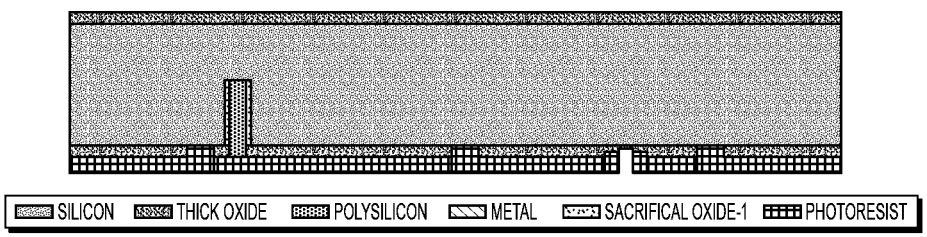
Figure 4L:
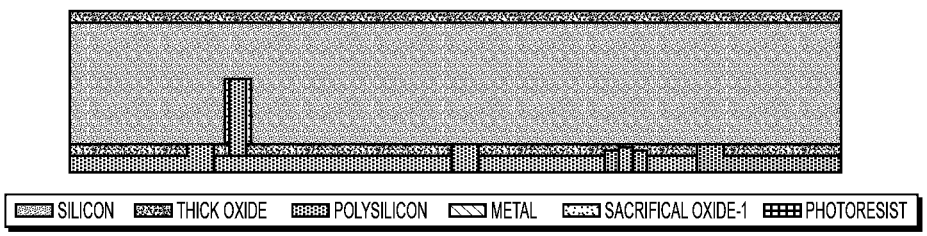
Figure 4M:
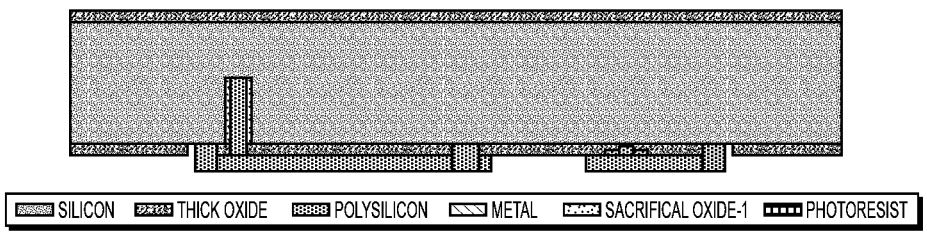
Figure 4N:
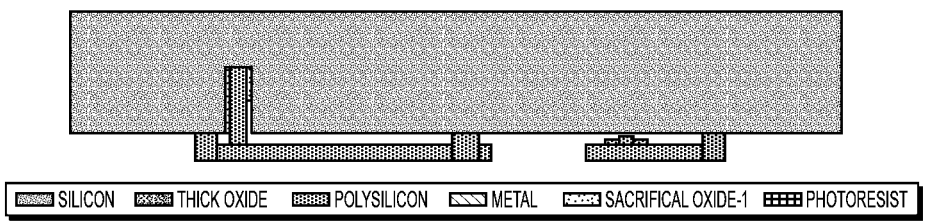
Figure 4O:
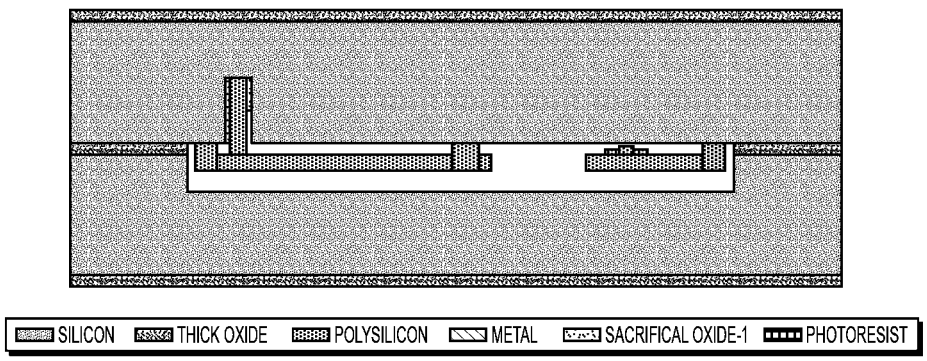
Figure 4R:
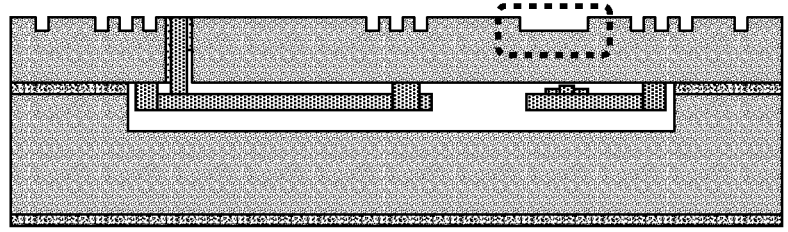
Figure 4R:
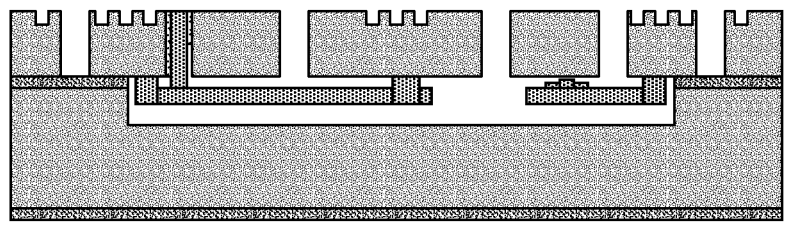
Figure 4S:
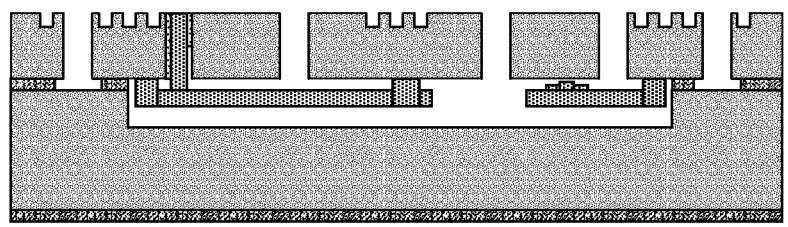
Figure 4T:
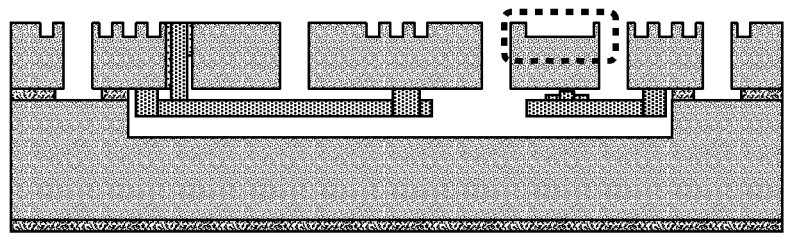
Figure 4T:
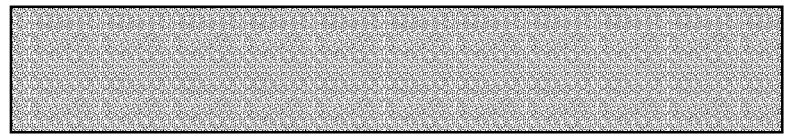
Figure 4U:
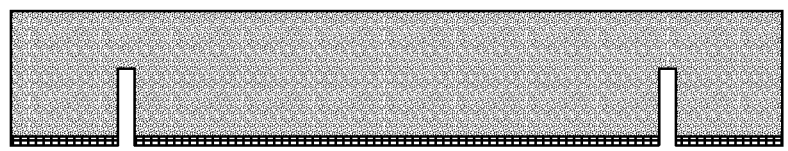
Figure 4V:
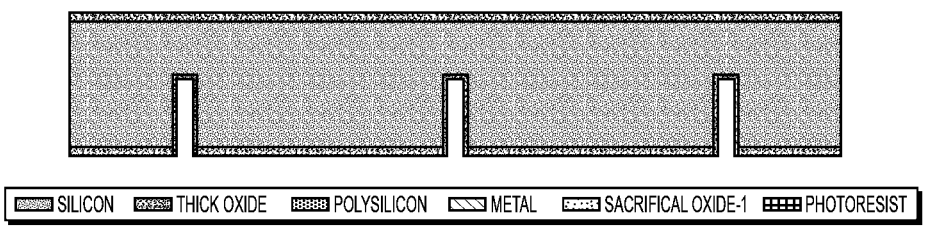
Figure 4W:
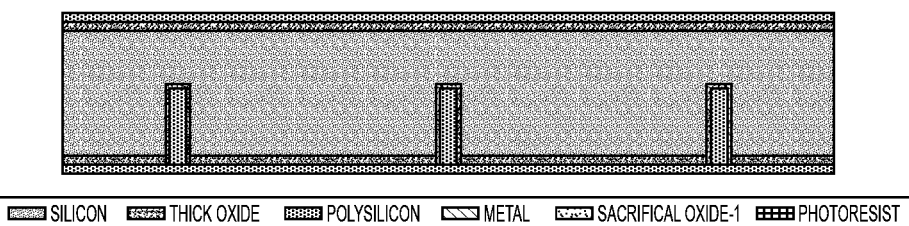
Figure 4X:
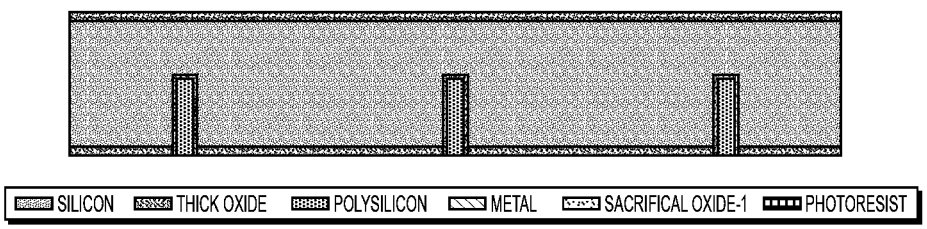
Figure 4Y:
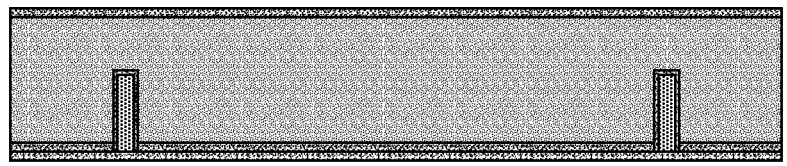
Figure 4Z:
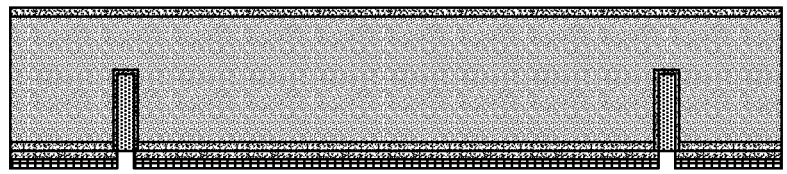
Figure 4A:
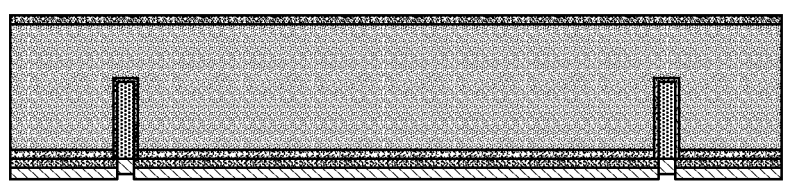
Figure 4B:
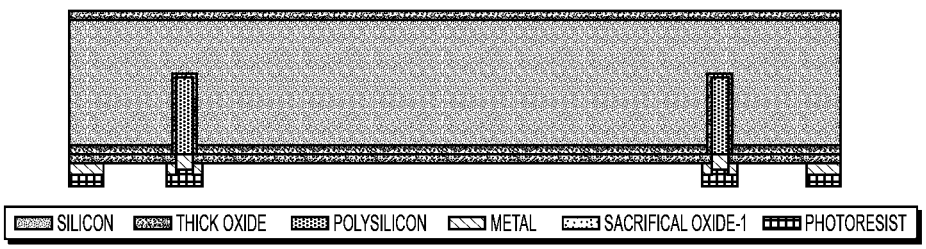
Figure 4C:
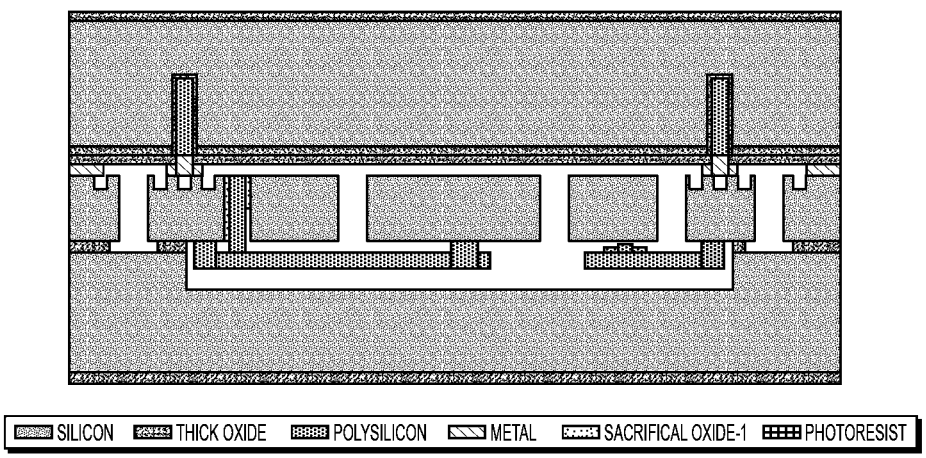
Figure 4E:
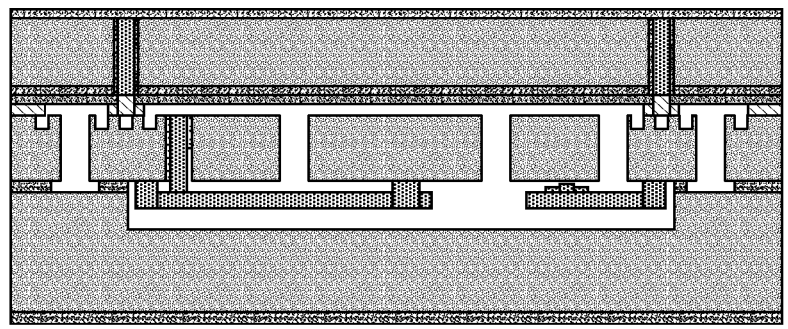
Figure 4F:
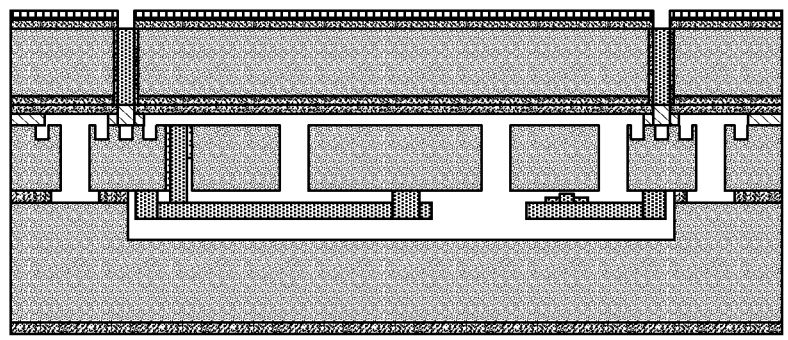
Figure 4G:
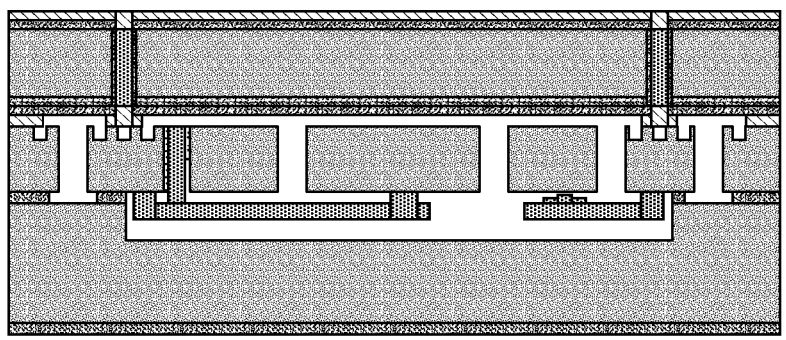
Figure 4H:
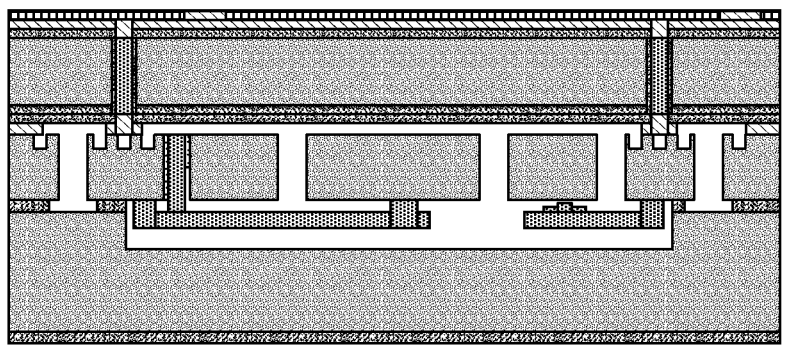
Figure 4I:
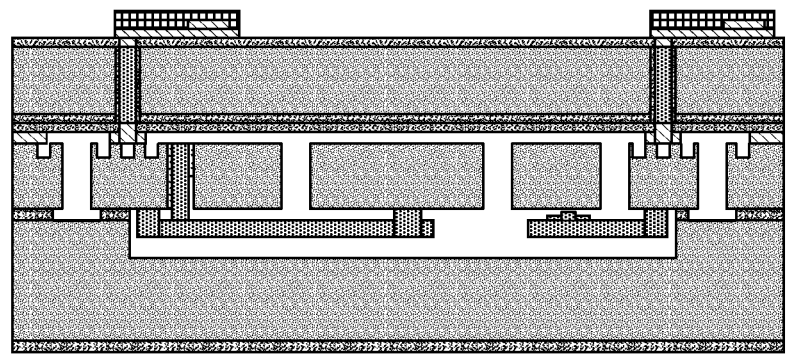
Figure 4J:
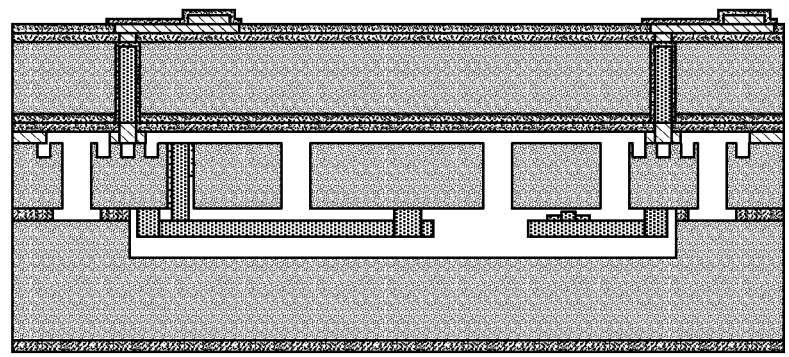
Figure 4K:
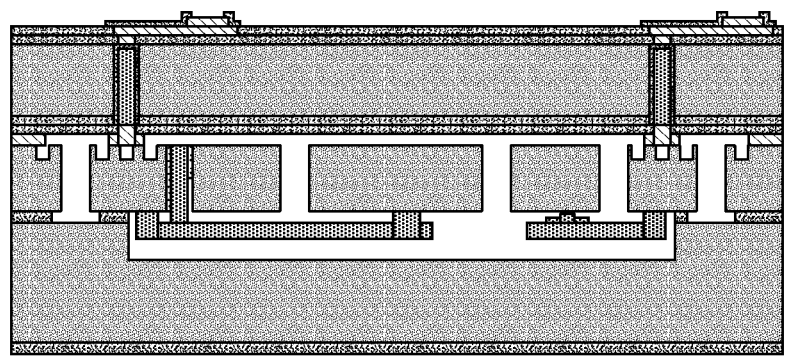

The process for fabricating MEMS devices 10A-10C will be better understood in conjunction with the Figures which are arranged in synchronization with the described process steps numbered 1-38, as illustrated in the Figures. The fabrication process comprises the following noteworthy steps:

forming cavities in a first silicon substrate, e.g. the base wafer 12, as illustrated by process steps 1-3 and FIGS. 2A-C, 3A-C and 4A-C;

etching trenches in a second silicon substrate, e.g. the MEMS wafer 14, as illustrated by process step 7 and FIGS. 2F, 3F and 4F;

conformally coating the sidewalls of the trenches in the second silicon substrate with an insulator, e.g. an oxide, as illustrated by process step 8 and FIGS. 2G, 3G and 4G;

filling the coated trenches in the second silicon substrate with polysilicon, wherein electrodes are derived from the polysilicon, as also illustrated by process step 8 and FIGS. 2G, 3G and 4G;

patterning the surface insulator on the second silicon substrate to open holes in the insulator and (optionally) to thin the insulator in select locations, as illustrated by process steps 10-12 and FIGS. 2I-K, 3I-K and 4I-K;

depositing a film of polysilicon and patterning such film to ensure the polysilicon filling the trenches is mechanically and electrically connected to the second silicon substrate in select location as illustrated by process steps 13-14 FIGS. 2L-M, 3L-M and 4L-M;

removing the surface insulator on the second silicon wafer and partially removing a portion of the insulator on the trench sidewalls, as illustrated by process step 15 and FIGS. 2N, 3N and 4N;

bonding the second silicon substrate to the first silicon substrate, as illustrated by process step 16 and FIGS. 2O, 3O and 4O;

thinning the bonded stack to achieve a specific remaining thickness of the second silicon substrate, as illustrated by process step 17 and FIGS. 2P, 3P and 4P;

patterning features to promote bonding on the outer surface of the second silicon substrate, as illustrated by process step 18 and FIGS. 2Q, 3Q and 4Q; Note variations of process step 18 are illustrated in FIGS. 2Q1 and 2Q2, 3Q1 and 3Q2, and 4Q1 and 4Q2 contributing to the final structures illustrated in FIGS. 6A-C and 7A-C;

patterning and etching flexures and electrical isolation trenches in the second silicon substrate, as illustrated by process step 19 and FIGS. 2R, 3R and 4R;

etching the remaining insulator on the trench sidewalls, as illustrated by process step 20 and FIGS. 2S, 3S and 4S; Note variations of process step 20 are illustrated in FIGS. 2S1, 3S1 and 4S1 contributing to the final structures illustrated in FIGS. 6A-C;

providing a third silicon substrate, the cap wafer as illustrated by process step 21 and FIGS. 2T, 3T and 4T;

forming electrical routing structures on the third silicon substrate using standard silicon process techniques to either form through-silicon vias (TSVs), lateral feedthroughs, or a CMOS circuit, as illustrated by process steps 21-27 and FIGS. 2N-Z, 3N-Z and 4N-Z;

providing an electrically-conducting, mechanically-robust, hermetic material on the outer surface of the third silicon substrate patterned so as to mate with receptor structures on the second silicon substrate, as illustrated by process steps 28-29 and FIGS. 2AA-BB, 3AA-BB and 4AA-BB;

bonding the third silicon substrate to the second silicon substrate to provide electrical connections from the outer surface or edge of the third silicon substrate to the MEMS structures formed in the second silicon substrate, as illustrated by process step 30 and FIGS. 2CC, 3CC and 4CC;

thinning the third silicon substrate to expose any external electrical connections (if using TSVs) or thinning the first/second silicon substrate to expose the external electrical connections (if using lateral feedthroughs or a CMOS circuit), as illustrated by process step 31 and FIGS. 2DD, 3DD and 4DD; Note variations of process steps 31 are illustrated in FIGS. 2DD1, 3DD1 and 4DD1 contributing to the final structures illustrated in FIGS. 6A-C; and using standard silicon processing techniques to ensure the electrical connections are made with the outside world, as illustrated by process steps 32-38 and FIGS. 2EE-KK, 3EE-KK and 4EE-KK.

The above described process results in the silicon based MEMS devices 10A, 10B and 10C having the structures illustrated in FIGS. 1A, 1B and 1C, respectively, all of which are free of Silicon On Insulator (SOI) substrates. Other possible variations of the process described herein may optionally include partially etching the second silicon substrate top surface in the resonator region during process step 18 to create a thinner MEMS device for certain of the MEMS functionalities, i.e. for an x-gyroscope while the z-gyroscope maintains the thickness established in step 17.

Figure 7A:
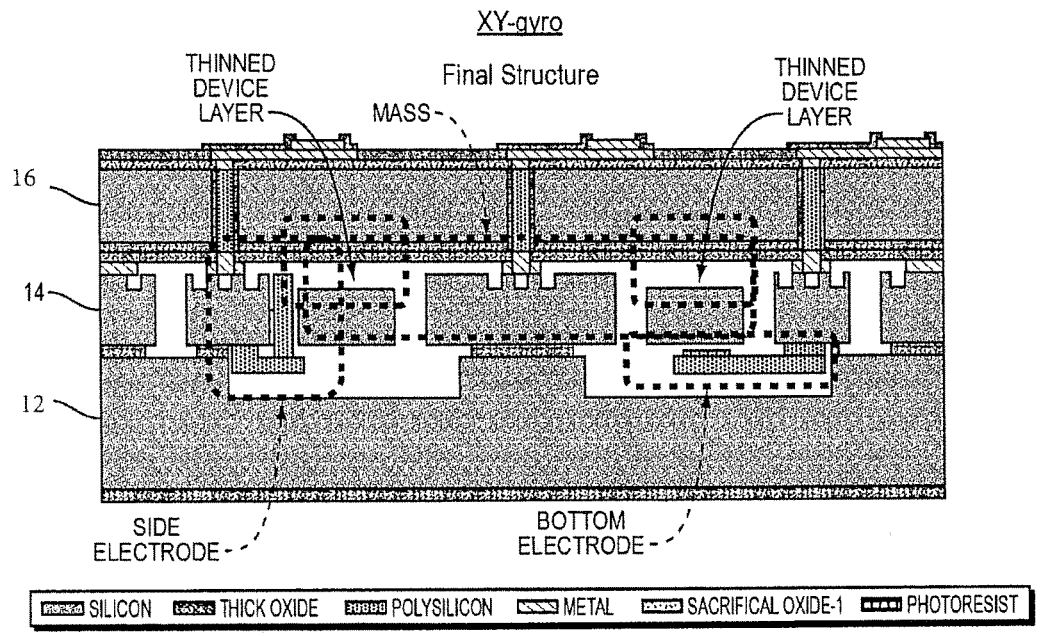
FIG. 7A illustrates conceptually a cross-sectional view of an X-axis gyroscope or a Y-axis gyroscope illustrating a two device layer thickness configuration in accordance with another embodiment of the present disclosure.
Figure 7B:
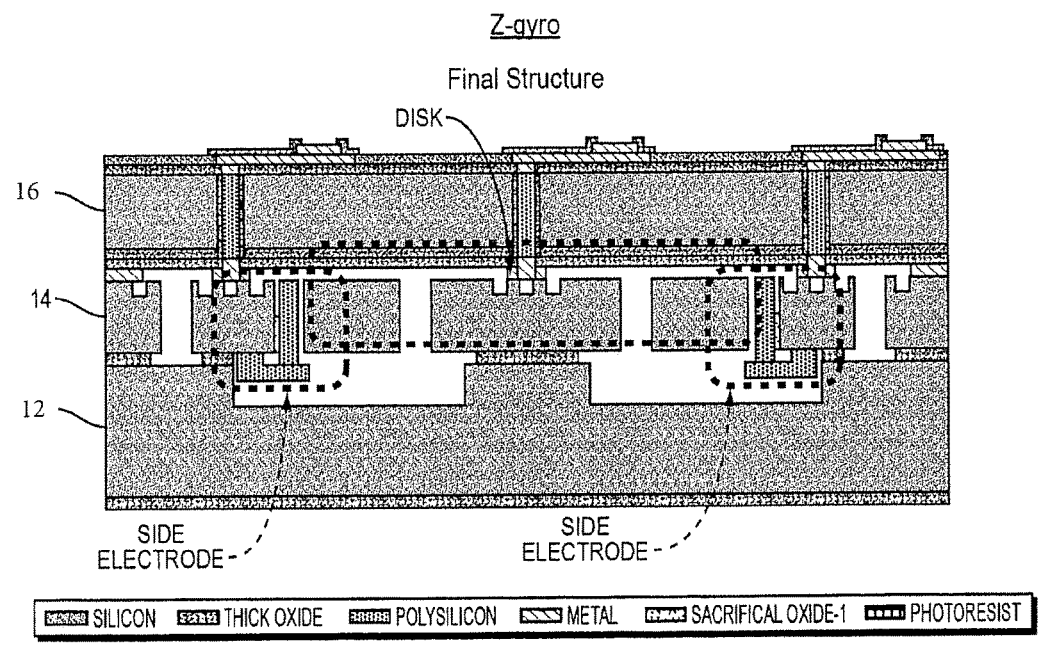
FIG. 7B illustrates conceptually a cross-sectional view of a Z-axis gyroscope illustrating a two device layer thickness configuration in accordance with another embodiment of the present disclosure.
Figure 7C:
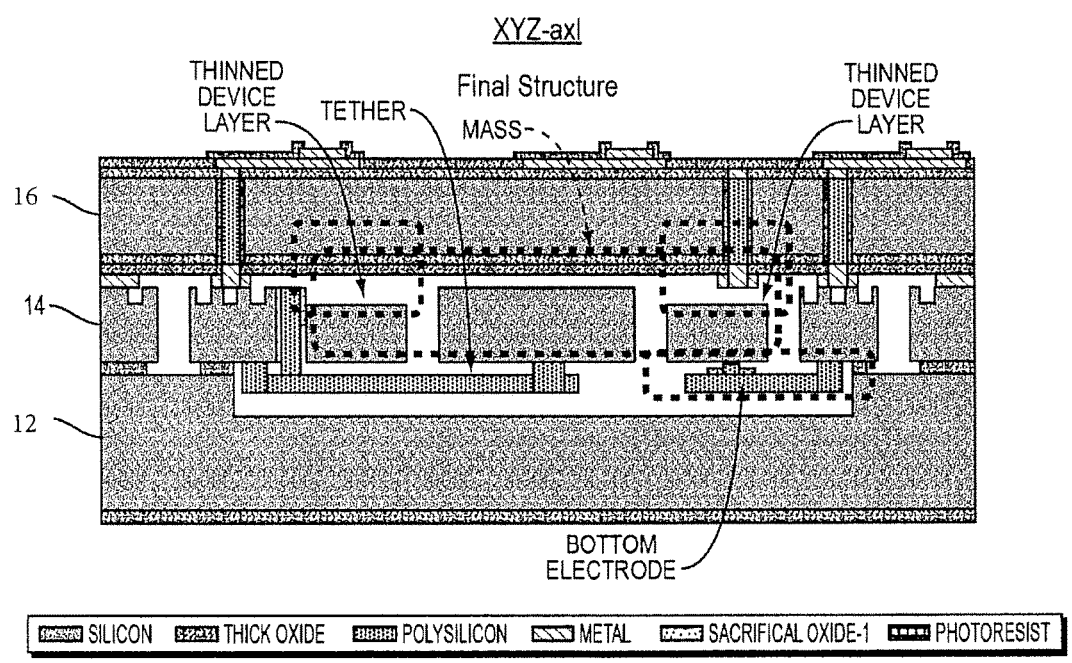
FIG. 7C illustrates conceptually a cross-sectional view of an XYZ accelerometer illustrating a two device layer thickness configuration in accordance with another embodiment of the present disclosure.

The MEMS devices having the structures illustrated in FIGS. 7A, 7B and 7C, result, at least in part, from the variations of process step 18 illustrated in FIGS. 2Q1, 3Q1, and 4Q1.

The MEMS devices having the structures illustrated in FIGS. 6A, 6B and 6C, including the electrode configurations, result, at least in part, from the variation of process step 18, as illustrated in FIGS. 2Q2, 3Q2, and 4Q2; the variation of process step 20, as illustrated in FIGS. 2S1, 3S1 and 4S1; and the variation of process step 31 are illustrated in FIGS. 2DD1, 3DD1 and 4DD1.

Another possible variation of the process described herein may optionally include adding extra masking steps to allow oxide openings to be formed on the cavity wafer in step 3, beneath which the silicon is not etched, allowing additional processing to enable an electrical contact to be made between the second silicon substrate and the first silicon substrate by patterning and etching a trench in the second silicon substrate after step 17, and then filling such trench with polysilicon that is appropriately doped to achieve conductivity.

The process disclosed herein provides multiple advances over current semiconductor manufacturing technologies including the following:

- No SOI required as starting material, therefore lower device manufacturing cost
- No requirement for deep reactive ion etching (DRIE) process that forms side electrodes to stop on buried oxide of SOI, therefore resulting in higher process yields with lower manufacturing costs and enabling use of higher aspect ratio etching, which, in turn, further enables designs to use thicker device layers, which allows for resonator designs that operate using higher-order modes and are able to sense multiple axes of rotation with one resonator proof mass
- Possible to use deeper partial DRIE etch of device layer in step 18 to thin resonator device in selective regions, thereby enabling wider design space for resonators
- Allows for sacrificial oxide to be pre-etched prior to fusion bonding (steps 15 and 16), so that final release process (step 20) can be shorter, thereby enabling device area reduction by undercutting the blocks of Si supporting the poly electrodes less
- Eliminates tetraethyl orthosilicate (TEOS) low pressure chemical vapor deposition (LPCVD) steps used to fill trenches in current monolithic multi-axis gyro and accelerometer HARPSS fabrication process, therefore lower device manufacturing cost The manufacturing and fabrication processes described herein are utilized in illustrative examples with the manufacture of MEMS devices that are capable of sensing rotational and translational motion around and along all three axes of free space, more specifically MEMS devices capable of sensing rotational angle or angular velocity of rotation) and translational motion (linear acceleration), around and along axes of free space. For example such a semiconductor device may include in a single package any combination of the MEMS devices 10A, 10B and 10C having the structures illustrated in FIGS. 1A, 1B and 1C, respectively.

The manufacturing and fabrication processes described herein may be utilized to manufacture an inertial measurement MEMS semiconductor apparatus comprising a single resonator mass capable of sensing rotation about multiple axes of rotation relative to the apparatus, such apparatus may have a portion thereof with cross-sectional views similar to the X-axis gyroscope or Y-axis gyroscope, as illustrated in FIG. 1A, and, at another portion thereof, may have a cross-sectional view similar to the Z-axis gyroscope, as illustrated in FIG. 1B. In one embodiment, the inertial measurement MEMS semiconductor apparatus is capable of sensing angular velocity of rotation around about multiple axes of rotation relative to the apparatus. In another embodiment, the apparatus is capable of sensing linear acceleration about multiple axes of rotation relative to the apparatus.

It will be obvious to those reasonably skilled in the arts that the techniques disclosed herein may be similarly applied to the manufacture and fabrication of other semiconductor devices given the disclosure contained herein.

The present disclosure is illustratively described above in reference to the disclosed embodiments. Various modifications and changes may be made to the disclosed embodiments by persons skilled in the art without departing from the scope of the present disclosure as defined in the appended claims.

What is claimed is:

1. A MEMS sensor comprising:
    a first wafer having a cavity;
    a second wafer bonded to the first wafer, the second wafer having a mass portion and an electrode support portion;
    a third wafer bonded to the second wafer, the third wafer serving as a cap and having electrical routing; and
    an electrode connected to a bottom surface of the electrode support portion,
    wherein at least a part of the electrode is disposed inside the cavity in a cross-sectional view.

2. The MEMS sensor of claim 1, wherein the electrode comprises a side electrode disposed between a sidewall of the mass portion and a sidewall of the electrode support portion.

3. The MEMS sensor of claim 1, wherein the electrode comprises a side electrode disposed between a sidewall of the mass portion and a sidewall of the electrode support portion,
    wherein an insulator is disposed between the side electrode and the sidewall of the electrode support portion, and
    wherein the insulator is thinner than the electrode support portion.

4. The MEMS sensor of claim 1, wherein the electrode comprises a side electrode disposed between a sidewall of the mass portion and a sidewall of the electrode support portion, and
    wherein, in the cross-sectional view, a top surface of the side electrode is aligned with a top surface of the mass portion or with a top surface of the electrode support portion.

5. The MEMS sensor of claim 1, wherein the electrode comprises a side electrode disposed between a sidewall of the mass portion and a sidewall of the electrode support portion,
    wherein the mass portion includes a reduced-thickness portion, and
    wherein a top surface of the reduced-thickness portion is lower than a top surface of the side electrode in the cross-sectional view.

6. The MEMS sensor of claim 1, wherein the electrode comprises a bottom electrode disposed below the mass portion, the bottom electrode overlapping a bottom surface of the mass portion in a thickness direction with a space therebetween in the cross-sectional view.

7. The MEMS sensor of claim 6, wherein the bottom electrode includes an increased-thickness portion protruding toward the mass portion in the cross-sectional view.

8. The MEMS sensor of claim 1, further comprising:
a top electrode disposed on the third wafer,
wherein the mass portion has a reduced-thickness portion, and
wherein the top electrode overlaps a top surface of the reduced-thickness portion in a thickness direction in the cross-sectional view.

9. The MEMS sensor of claim 8, wherein the top electrode protrudes toward the reduced-thickness portion.

10. The MEMS sensor of claim 1, further comprising:
a top electrode disposed on the third wafer,
wherein the electrode comprises a bottom electrode disposed below the mass portion, and
wherein the top electrode and bottom electrode overlap each other in a thickness direction.

11. The MEMS sensor of claim 1, wherein the bottom surface of the electrode support portion and the first wafer are bonded to each other by an oxide anchor, and
wherein the oxide anchor has a fan-shape in a plan view.

12. The MEMS sensor of claim 11, wherein the electrode support portion has a fan-shape in the plan view.

13. The MEMS sensor of claim 1, wherein the electrode comprises a side electrode disposed between a sidewall of the mass portion and a sidewall of the electrode support portion,
wherein a first insulator is disposed between the side electrode and the sidewall of the electrode support portion, and
wherein a second insulator is disposed between the side electrode and the sidewall of the mass portion.

14. The MEMS sensor of claim 13, wherein the second insulator is thinner than the first insulator.

15. The MEMS sensor of claim 1, wherein the electrode is connected to a bottom surface of the mass portion.

16. The MEMS sensor of claim 1, wherein the electrode is connected to a center of a bottom surface of the mass portion.

17. The MEMS sensor of claim 8, wherein the top electrode is disposed on a bottom surface of the third wafer.

18. The MEMS sensor of claim 10, wherein the top electrode is disposed on a bottom surface of the third wafer.

* * * * *